US012720971B2

(12) United States Patent
Kim et al.

(10) Patent No.: US 12,720,971 B2
(45) Date of Patent: Aug. 25, 2026

(54) DISPLAY PANEL AND ELECTRONIC APPARATUS INCLUDING THE SAME

(71) Applicant: Samsung Display Co., Ltd., Yongin-si (KR)

(72) Inventors: Ji-Sun Kim, Seoul (KR); Youngwan Seo, Suwon-si (KR); Kyunghoe Lee, Hwaseong-si (KR); Keunhee Choi, Hwaseong-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 869 days.

(21) Appl. No.: 17/901,827

(22) Filed: Sep. 1, 2022

(65) Prior Publication Data

US 2023/0071490 A1 Mar. 9, 2023

(30) Foreign Application Priority Data

Sep. 6, 2021 (KR) ........................ 10-2021-0118500

(51) Int. Cl.

| | |
|---|---|
| ***H10K 59/126*** | (2023.01) |
| *H10D 86/40* | (2025.01) |
| *H10D 86/60* | (2025.01) |
| *H10K 59/121* | (2023.01) |

(52) U.S. Cl.

CPC ......... *H10K 59/126* (2023.02); *H10D 86/441* (2025.01); *H10D 86/60* (2025.01); *H10K 59/1213* (2023.02)

(58) Field of Classification Search

CPC ............. H10K 59/126; H10K 59/1213; H10K 59/131; H10K 59/124; H10K 59/35; H10K 59/38; H10K 59/40; H10D 86/441; H10D 86/60

See application file for complete search history.

(56) References Cited

U.S. PATENT DOCUMENTS

| | | | | |
|---|---|---|---|---|
| 10,217,416 | B2 | 2/2019 | Lee et al. | |
| 10,879,319 | B2 | 12/2020 | Bang et al. | |
| 10,903,284 | B2 * | 1/2021 | Lee | G02B 1/11 |
| 11,152,442 | B2 * | 10/2021 | Kishimoto | H10D 30/673 |
| 11,723,238 | B2 | 8/2023 | Kim et al. | |
| 11,737,334 | B2 | 8/2023 | Woo et al. | |
| 2019/0206971 | A1 * | 7/2019 | Kim | H10K 59/123 |

(Continued)

FOREIGN PATENT DOCUMENTS

| | | |
|---|---|---|
| KR | 10-2019-0079487 | 7/2019 |
| KR | 20200032291 A | 3/2020 |

(Continued)

*Primary Examiner* — Tan N Tran

(74) *Attorney, Agent, or Firm* — Harness, Dickey & Pierce, P.L.C.

(57) ABSTRACT

A display panel includes a base layer having a first region, a second region, and a third region defined between the first region and the second region, the first region, the second region, and the third region being partitioned when viewed in plan, a driving circuit disposed in the second region, a first pixel disposed in the first region and a second pixel including a second light emitting device disposed in the second region to overlap the driving circuit when viewed in plan, and a shielding component disposed in the second region, and interposed between the driving circuit and the second light emitting device to receive a substantially constant voltage.

20 Claims, 12 Drawing Sheets

(56) References Cited

U.S. PATENT DOCUMENTS

| | | | | |
|---|---|---|---|---|
| 2020/0212158 | A1 | 7/2020 | Shim et al. | |
| 2021/0358897 | A1* | 11/2021 | Iguchi | G09G 3/32 |
| 2022/0013611 | A1 | 1/2022 | Park et al. | |

FOREIGN PATENT DOCUMENTS

| | | | |
|---|---|---|---|
| KR | 10-2020-0080899 | | 7/2020 |
| KR | 20210010716 | A | 1/2021 |
| KR | 20210077844 | A | 6/2021 |
| KR | 20220013611 | | 1/2022 |

* cited by examiner

LD3
AA3
DAA
VP
VD
V3
V2
V1
AA2
LD1
LD2
HH
HH
VSS
DPA
HH_V

FIG. 6C

LD3_C
AA3
DAA
VP
V3
VD
V2
V1
LD1_C
LD2_C
HH
AA2
VSS
HH_V
DPA

FIG. 7A

LD3
AA3
DAA
V3
V2
V1_1
VP
CRP
LD2
HH_1
AA2
VSS
HH_V
DPA

FIG. 7B

LD3
AA3
DAA
V3
V2
V1_2
CRP2
CRP1
VP
HH_2
AA2
VSS
HH_V
DPA

DISPLAY PANEL AND ELECTRONIC APPARATUS INCLUDING THE SAME

CROSS REFERENCE TO RELATED APPLICATION

This application claims priority from and the benefit of Korean Patent Application No. 10-2021-0118500, filed on Sep. 6, 2021, which is hereby incorporated by reference for all purposes as if fully set forth herein.

BACKGROUND

Field

Embodiments of the invention relate generally to display panels, and more particularly, to a display panel having a thin bezel and an electronic apparatus including the display panel.

Discussion of the Background

Multimedia electronic apparatuses, such as televisions, mobile phones, tablets, computers, navigation, or game consoles, include a display panel to display an image.

Recently, studies and research have been conducted in display devices to reduce the size of the region in which an image is not displayed to meet market demand for larger display regions. In addition, studies and research have been conducted to enlarge the display region for displaying an image and to reduce the bezel.

The above information disclosed in this Background section is only for understanding of the background of the inventive concepts, and, therefore, it may contain information that does not constitute prior art.

SUMMARY

Applicant realized that moving the driving circuit in display panels from the bezel region to the non-display may result in noise that interferes with the quality and/or performance of the display panel.

Display panels and electronic apparatuses constructed according to the principles and illustrative embodiments of the invention have a thin bezel by including the driving circuit in the display region of the display panel, instead of the bevel.

Display panels and electronic apparatuses constructed according to the principles and illustrative embodiments of the invention include the driving circuit in the display region of the display panel without adversely affecting the display quality or performance, e.g., by including a shield to prevent the driving circuit from interfering with other electronic components, including the pixels in the display region.

Additional features of the inventive concepts will be set forth in the description which follows, and in part will be apparent from the description, or may be learned by practice of the inventive concepts.

According to one aspect of the invention, a display panel includes a base layer having a first region, a second region, and a third region defined between the first region and the second region, a driving circuit spaced apart from the first region and disposed in the second region, a first pixel including a first pixel transistor disposed in the first region and a first light emitting device disposed in the first region and connected to the first pixel transistor, a second pixel including a second pixel transistor disposed in the third region, and a second light emitting device disposed in the second region to overlap the driving circuit when viewed in plan, and connected to the second pixel transistor, and a shielding component disposed in the second region, interposed between the driving circuit and the second light emitting device to receive a substantially constant voltage.

The shielding component may be configured to provide the substantially constant voltage to the driving circuit.

The substantially constant voltage may be a gate turn-off voltage or a gate turn-on voltage.

The shielding component may include a shielding electrode including a plurality of openings exposing an organic layer.

The plurality of openings may include the plurality of through holes spaced apart from the first and second light emitting devices when viewed in plan.

The display panel may further include an initialization voltage line connected to the pixels and a power supply voltage line connected to the pixels. The shielding electrode may be spaced apart from the initialization voltage line and the power supply voltage line when viewed in plan.

The second pixel may further include a connection line connecting the second light emitting device to the second pixel transistor. The connection line may be disposed in a layer different from that of the second light emitting device.

The shielding electrode may overlap with the connection line when viewed in plan.

The shielding electrode may be spaced apart the connection line when viewed in plan.

The display panel may further include: an initialization voltage line connected to the first pixel and the second pixel; and a power supply voltage line connected to the first pixel and the second pixel, wherein the shielding component may be spaced apart from the initialization voltage line and the power supply voltage line when viewed in plan.

According to another aspect of the invention, an electronic apparatus includes a base layer having a first region and a second region, a driving circuit including a plurality of stage circuits spaced apart from the first region and disposed in the second region and a conductive pattern to provide the substantially constant voltage to each of the stage circuits, a first pixel including a first light emitting device disposed in the first region, and a second pixel including a second light emitting device disposed in the second region. The conductive pattern overlaps the second light emitting device when viewed in plan.

The electronic apparatus may further include a conductive line to supply the substantially constant voltage to the first pixel and the second pixel. The conductive pattern may be spaced apart from the conductive line when viewed in plan.

The substantially constant voltage may be a gate turn-off voltage or a gate turn-on voltage.

The electronic apparatus may further include a power supply line to provide a power supply voltage to the first pixel and the second pixel. The conductive pattern may be spaced apart from the power supply line when viewed in plan.

The conductive pattern may include a plurality of vertical parts and a plurality of intersecting parts connected to the vertical parts. The conductive pattern may have a plurality of openings defined at least in part by the vertical parts and the intersecting parts.

The plurality of openings may include a plurality of through holes exposing an organic layer.

The plurality of openings may be defined by the first and second light emitting devices.

At least some of the intersecting parts may be inclined with an acute angle with respect to each of the vertical parts.

At least some of the intersecting parts may be interposed between the vertical parts, and may include a first part interposed between the vertical parts and inclined in one direction, and a second part interposed between the vertical parts, connected to the first part, and inclined in a direction different than one direction.

The first pixel may include a first thin film transistor including an oxide semiconductor, and a second thin film transistor including silicon.

The electronic apparatus may further include a color filter disposed on the first pixel and a sensing layer interposed between the first pixel and the color filter to sense an external input.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 4A is a cross-sectional view taken along line I-I' of FIG. 3.

FIG. 4B is a cross-sectional view of another embodiment of the display panel taken along line I-I' of FIG. 3.

FIG. 6B is a plan view of another embodiment of regions AA2, and AA3

FIG. 6C is a plan view of another embodiment of the regions shown in FIG. 6B.

FIGS. 7A and 7B are plan views of yet other embodiments of the regions shown in FIG. 6B.

DETAILED DESCRIPTION

Figure 1:
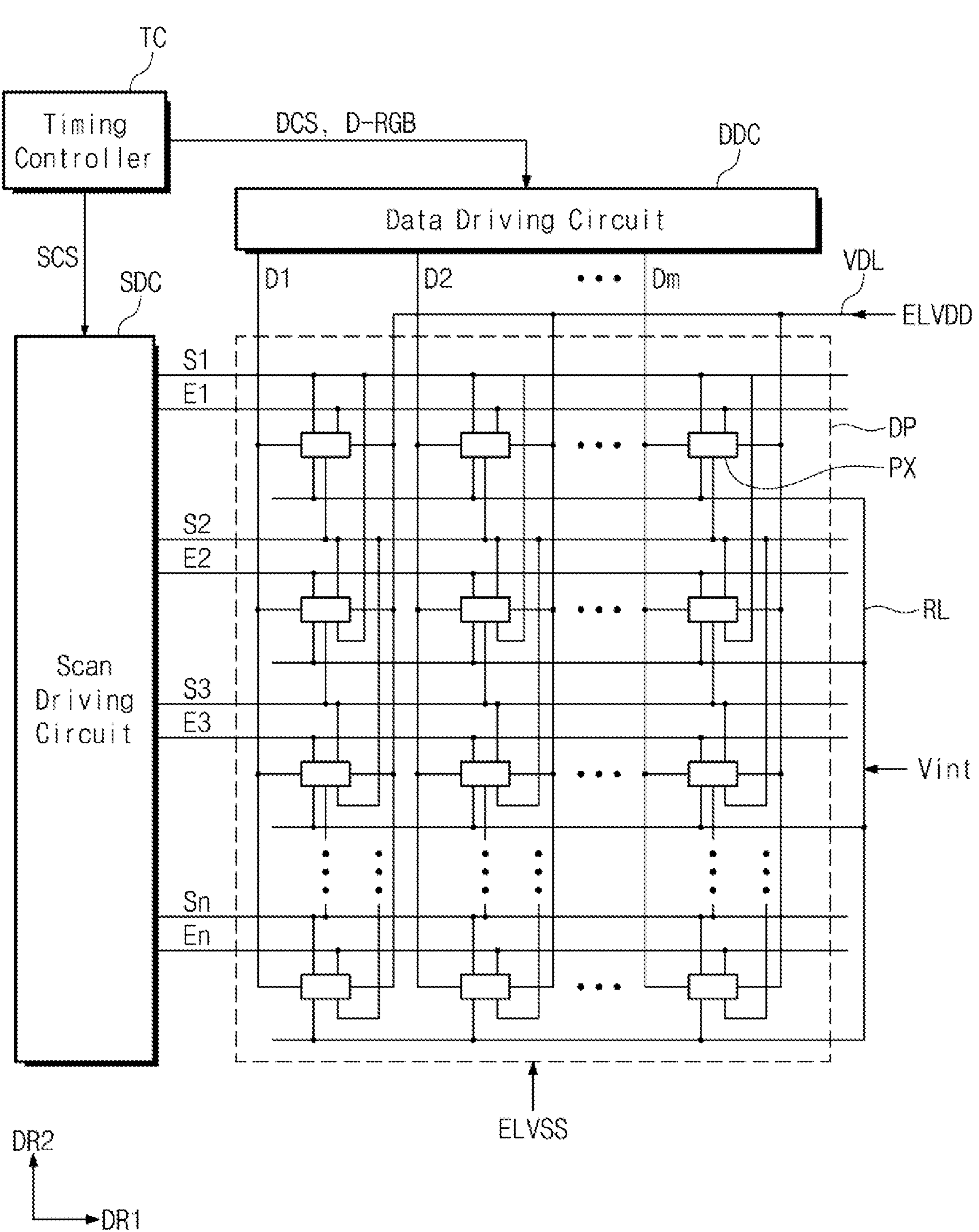
FIG. 1 is a block diagram of an embodiment of an electronic apparatus including a display panel constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of an embodiment of an electronic apparatus constructed according to the principles of the invention. The electronic apparatus may be a semiconductor device including at least one semiconductor chip. The electronic apparatus may include a timing controller TC, a scan driving circuit SDC, a data driving circuit DDC, and a display panel DP. The display panel DP may display an image in response to an electrical signal.

The following description is based on the case in which the display panel DP is an organic light emitting display panel by way of example. The example of the display panel DP is provided only for illustrative purposes, and the display panel DP may include various embodiments.

The timing controller TC may receive input image signals, and transform a data format of the input image signals to generate image data D-RGB which is comparable with an interface specification of the scan driving circuit SDC. The timing controller TC may output the image data D-RGB and various control signals DCS and SCS.

The scan driving circuit SDC may receive a scan control signal SCS from the timing controller TC. The scan control signal SCS may include a vertical start signal for starting an operation of the scan driving circuit SDC, and a clock signal for determining an output timing of signals.

The scan driving circuit SDC may generate a plurality of scan signals and sequentially output the scan signals to a plurality of scan lines SL1 to SLn. In addition, the scan driving circuit SDC may generate a plurality of light emitting control signals in response to the scan control signal SCS, and output the light emitting control signals to a plurality of light emitting lines EL1 to ELn.

Although FIG. 1 illustrates that the scan signals and the light emitting control signals are output from one scan driving circuit SDC, embodiments are not limited thereto. For example, a plurality of scan driving circuits may separately output the scan signals, and may separately output the light emitting control signals. In addition, a driving circuit to generate and output scan signals and a driving circuit to generate and output light emitting control signals may be separately provided.

The data driving circuit DDC may receive the data control signal DCS and the image data D-RGB from the timing controller TC. The data driving circuit DDC may transforms the image data D-RGB into data signals and output the data signals to the data lines DL1 to DLm. The data signals may be analog voltages corresponding to grayscale values of the image data D-RGB.

The display panel DP may include the scan lines SL1 to SLn, the light emitting lines EL1 to ELn, the data lines DL1 to DLm, and pixels PX. The scan lines SL1 to SLn may extend in a first direction DR1 and may be arranged in a second direction DR2 intersecting the first direction DR1.

Each of the plurality of light emitting lines EL1 to ELn may be arranged in parallel with a corresponding scan line of the scan lines SL1 to SLn. The data lines DL1 to DLm may intersect the scan lines SL1 to SLn to be insulated from the scan lines SL1 to SLn.

Each of the plurality of pixels PX may be connected to a relevant scan line of the scan lines SL1 to SLn, a relevant light emitting line of the light emitting lines EL1 to ELn, and a data line of the data lines DL1 to DLm.

Each of the pixels PX may receive a first power supply voltage ELVDD and a second power supply voltage ELVSS having a level lower than that of the first power supply voltage ELVDD. Each of the pixels PX may be connected to a driving power line VDL to which the first power supply voltage ELVDD (hereinafter, driving voltage) is applied. Each of the pixels PX may be connected to an initialization line RL that receives an initialization voltage Vint.

Each of the pixels PX may be electrically connected to three scan lines. As illustrated in FIG. 1, pixels positioned in a second pixel row may be connected to the first, second, and third scan lines SL1 to SL3.

The display panel DP may further include a plurality of dummy scan lines. The display panel DP may further include a dummy scan line connected to pixels PX positioned in a first pixel row and a dummy scan line connected to pixels PX in an n-th pixel row. In addition, pixels (hereinafter, pixels in a pixel column) connected to any one of the data lines DL1 to DLm may be connected to each other. Two adjacent pixels of the pixels in the pixel column may be electrically connected to each other. However, this is provided for illustrative purposes. For example, the connection relationship between the pixels PX may be variously designed, and embodiments are not limited thereto.

Each of the pixels PX may include an organic light emitting diode and a pixel driving circuit that controls the organic light emitting diode to emit light. The pixel driving circuit may include a thin film transistor and a capacitor.

At least one of the scan driving circuit SDC or the data driving circuit DDC may include thin film transistors formed by the same process as that of the pixel driving circuit. For example, both the scan driving circuit SDC and the data driving circuit DDC may be mounted on the display panel DP. Alternatively, one of the scan driving circuit SDC and the data driving circuit DDC may be mounted on the display panel DP, and a remaining one of the scan driving circuit SDC and the data driving circuit DDC may be provided to a separate circuit board independent from the display panel DP and connected to the display panel DP.

Figure 2A:
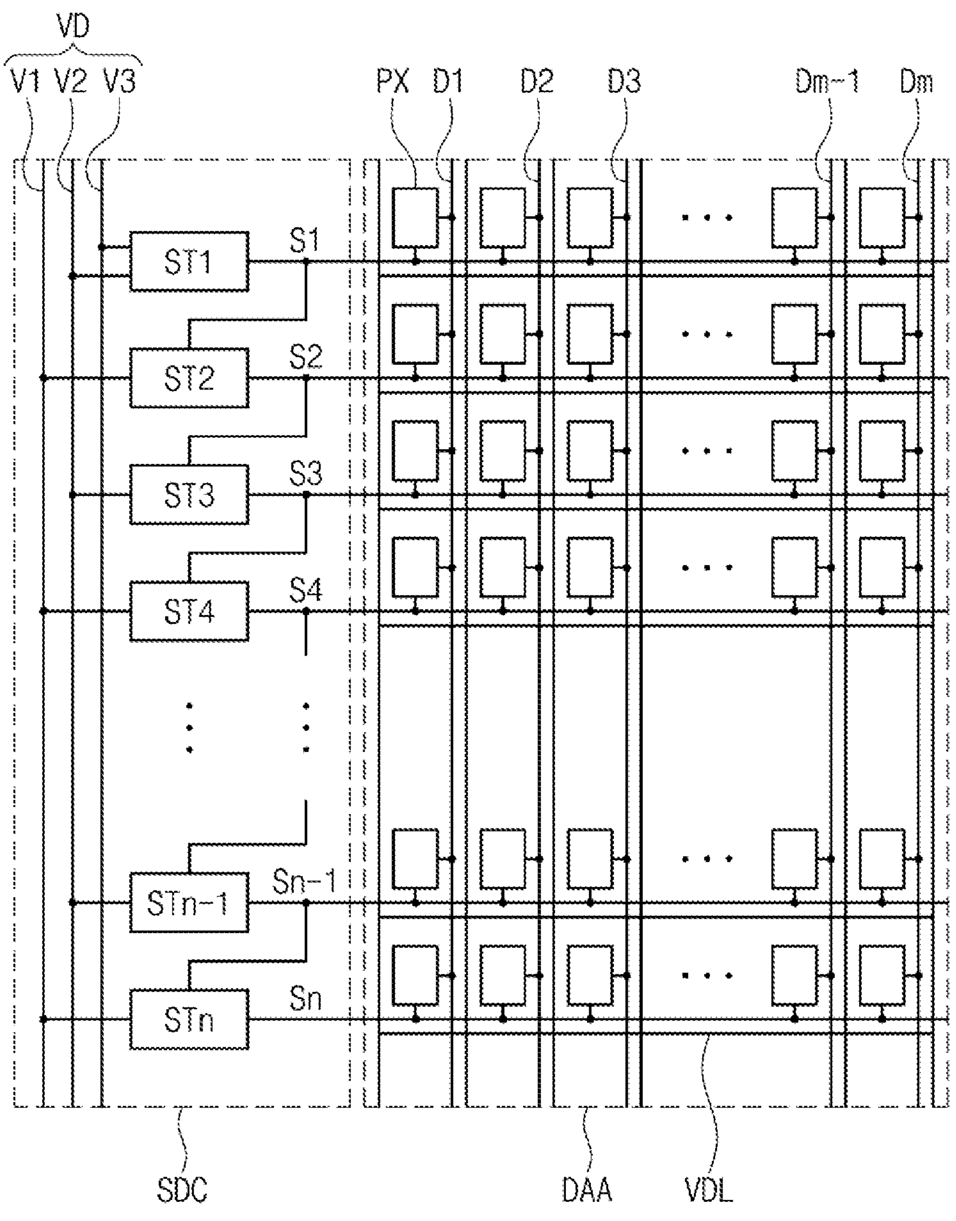
FIG. 2A is a block diagram illustrating a portion of the display panel of the electronic apparatus of FIG. 1.
Figure 2B:
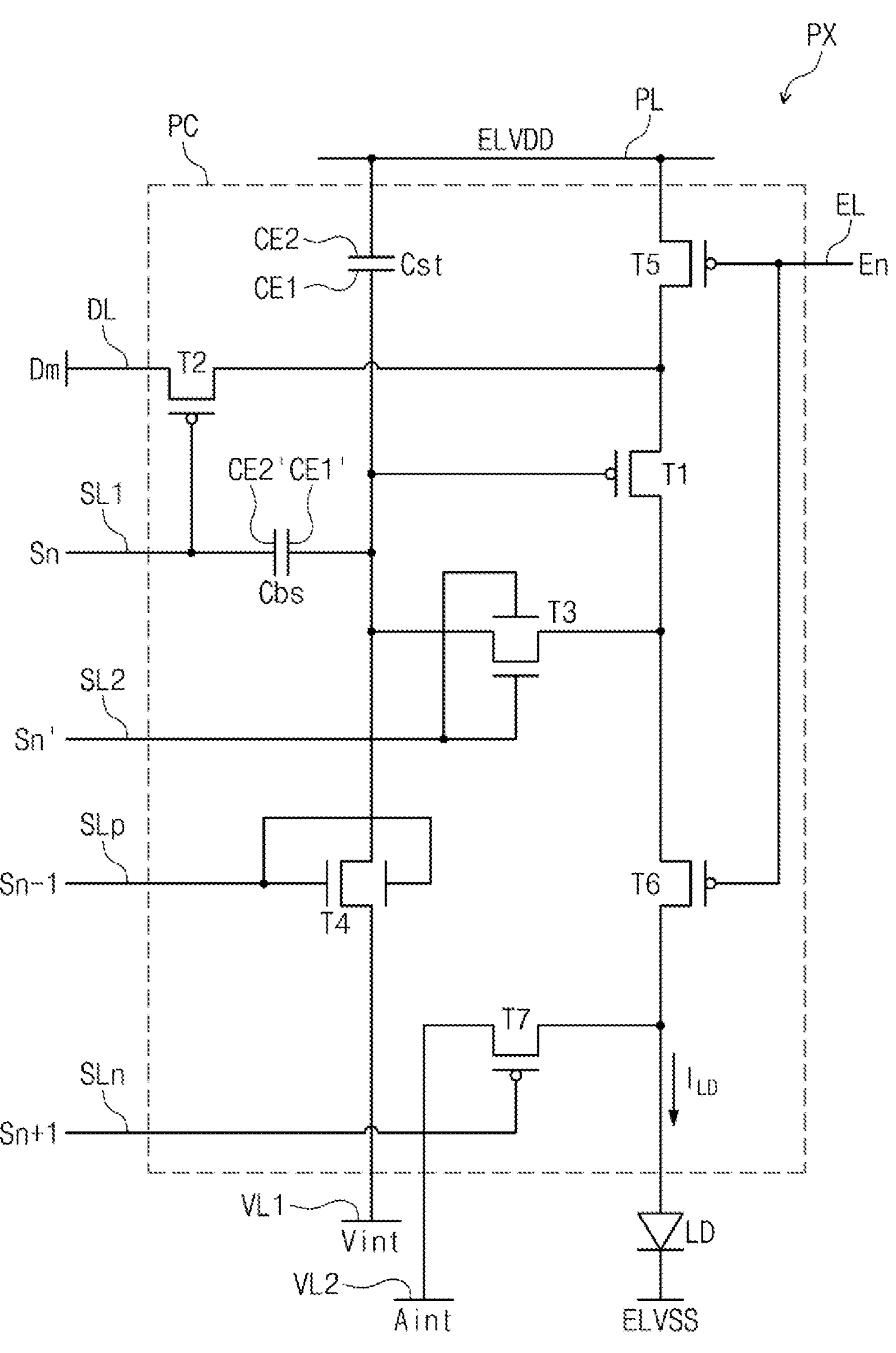
FIG. 2B is an equivalent circuit diagram of a representative pixel of the display panel of FIG. 2A.

FIG. 2A is a block diagram illustrating a portion of the display panel of the electronic apparatus of FIG. 1. FIG. 2B is an equivalent circuit diagram of a representative pixel of the display panel of FIG. 2A. Hereinafter, embodiments will be described with reference to FIGS. 2A and 2B.

Referring to FIG. 2A, the scan driving circuit SDC may include a driving signal line VD and a plurality of stage circuits ST1 to STn. The stage circuits ST1 to STn may provide scan signals S1 to Sn to relevant scan lines. In FIG. 2A, the light emitting lines EL1 to ELn are omitted for illustrative convenience.

The stage circuits ST1 to STn may be dependently connected to each other. For example, the scan signal S1, which is generated from the first stage circuit ST1 of the stage circuits ST1 to STn, may be provided to relevant pixel rows of an active region AA and may be transmitted to the second stage circuit ST2 which is a next stage circuit. Accordingly, the stage circuits ST1 to STn may sequentially provide the scan signals S1 to Sn to the pixels PX. However, this is provided only for illustrative purposes. For example, the connection relationship between the stage circuits ST1 to STn may be variously modified, and embodiments are not limited thereto.

The driving signal line VD may include a plurality of lines V1, V2, and V3. The lines V1, V2, and V3 may transmit signals, which are independent from each other, to the stage circuits ST1 to STn. The lines V1, V2, and V3 may be lines connected to the timing controller TC to transmit the scan control signal SCS (see FIG. 1). Alternatively, the lines V1, V2, and V3 may be lines to transmit a power supply voltage to the stage circuits ST1 to STn.

At least one of the lines V1, V2, or V3 may transmit a substantially constant voltage (e.g., DC voltage). For example, the first line V1 among the lines V1, V2, and V3 may transmit a gate turn-off voltage VGL or a gate turn-on voltage VGH. The driving signal line VD may include various lines that provide signals to the stage circuits ST1 to STn, and embodiments are not limited thereto.

FIG. 2B illustrates an equivalent circuit of a representative pixel PX of the plurality of pixels PX. The pixel PX may include a light emitting device LD and a pixel circuit PC. The light emitting device LD may be a component included in a light emitting device layer 130 of FIG. 4A, which is to be described subsequently, and the pixel circuit PC may be a component included in a circuit layer 120 of FIG. 4A.

The pixel circuit PC may include a plurality of thin film transistors T1 to T7 and a storage capacitor Cst. The plurality of thin film transistors T1 to T7 and the storage capacitor Cst may be electrically connected to signal lines SL1, SL2, SLp, SLn, EL, and DL, a first initialization voltage line VL1, a second initialization voltage line VL2 (e.g., an anode initialization voltage line), and a driving voltage line PL. At least one (e.g., the driving voltage line PL) of the above-described lines may be shared between adjacent pixels PX.

The plurality of thin film transistors T1 to T7 may include the driving thin film transistor T1, the switching thin film transistor T2, the compensation thin film transistor T3, the first initialization thin film transistor T4, the operation control thin film transistor T5, the light emitting control thin film transistor T6, and the second initialization thin film transistor T7.

The light emitting device LD may include a first electrode (e.g., an anode electrode or a pixel electrode) and a second electrode (e.g., a cathode electrode or a common electrode), and the first electrode of the light emitting device LD may be connected to the driving thin film transistor T1 through the light emitting control thin film transistor T6 to receive a driving current $I_{LD}$, and the second electrode of the light emitting device LD may receive the low power supply voltage ELVSS. The light emitting device LD may generate light having a brightness corresponding to the driving current $I_{LD}$.

Some of the plurality of thin film transistors T1 to T7 may be provided in the form of an n-channel MOSFET (NMOS), and remaining thin film transistors of the plurality of thin film transistors T1 to T7 may be provided in the form of a p-channel MOSFET (PMOS). For example, among the plurality of thin film transistors T1 to T7, the compensation thin film transistor T3 and the first initialization thin film transistor T4 may be provided in the form of an n-channel MOSFET (NMOS), and remaining thin film transistors may be provided in the form of a p-channel MOSFET (PMOS).

With respect to the plurality of thin film transistors T1 to T7, the compensation thin film transistor T3, the first initialization thin film transistor T4, and the second initialization thin film transistor T7 may be provided in the form of an NMOS, and the remaining thin film transistors may be provided in the form of a PMOS. Alternatively, only one thin film transistor may be provided in the form of an NMOS and remaining thin film transistors may be provided in the form of a PMOS. Alternatively, all thin film transistors T1 to T7 may be provided in the form of an NMOS or a PMOS.

Signal lines may include the first scan line SL1 to transmit a first scan signal Sn, the second scan line SL2 to transmit a second scan signal Sn', a previous scan line SLp to transmit a previous scan signal Sn−1 to the first initialization thin film transistor T4, a light emitting control line EL to transmit a light emitting control signal En to the operation control thin film transistor T5 and the light emitting control thin film transistor T6, a next scan line SLn to transmit a next scan signal Sn+1 to the second initialization thin film transistor T7, and a data line DL to transmit a data signal Dm while intersecting the first scan line SL1.

A driving voltage line PL may transmit the driving voltage ELVDD to the driving thin film transistor T1, and the first initialization voltage line VL1 may transmit the initialization voltage Vint for initializing the driving thin film transistor T1 and the pixel electrode.

A driving gate electrode of the driving thin film transistor T1 may be connected to the storage capacitor Cst, a driving source region of the driving thin film transistor T1 may be connected to the driving voltage line PL through the operation control thin film transistor T5, and a driving drain region of the driving thin film transistor T1 may be electrically connected to the first electrode of the light emitting device LD through the light emitting control thin film transistor T6. The driving thin film transistor T1 may receive the data signal Dm to supply the driving current ILD to the light emitting device LD according to the switching operation of the switching thin film transistor T2.

A switching gate electrode of the switching thin film transistor T2 may be connected to the first scan line SL1 to transmit the first scan signal Sn, a switching source region of the switching thin film transistor T2 may be connected to the data line DL, a switching drain region of the switching thin film transistor T2 may be connected to a driving source region of the driving thin film transistor T1 and connected to the driving voltage line PL through the operation control thin film transistor T5. The switching thin film transistor T2 may be turned on in response the first scan signal Sn received through the first scan line SL1 to perform a switching operation to transmit the data signal Dm, which is received in the data line DL, to the driving source region of the driving thin film transistor T1.

A compensation gate electrode of the compensation thin film transistor T3 may be connected to the second scan line SL2. A compensation drain region of the compensation thin film transistor T3 may be connected to the driving drain region of the driving thin film transistor T1 and may be connected to the pixel electrode of the light emitting device LD through the light emitting control thin film transistor T6. A compensation source region of the compensation thin film transistor T3 may be connected to a first capacitor electrode CE1 of the storage capacitor Cst and the driving gate electrode of the driving thin film transistor T1. In addition, the compensation source region may be connected to a first initialization drain region of the first initialization thin film transistor T4.

The compensation thin film transistor T3 may be turned on in response to the second scan signal Sn' received through the second scan line SL2 to electrically connect the driving gate electrode of the driving thin film transistor T1 and the driving drain region of the driving thin film transistor T1 to diode-connect the driving thin film transistor T1.

The first initialization gate electrode of the first initialization thin film transistor T4 may be connected to the previous scan line SLp. The first initialization source region of the first initialization thin film transistor T4 may be connected to the second initialization source region of the second initialization thin film transistor T7 and the first initialization voltage line VL1. The first initialization drain region of the first initialization thin film transistor T4 may be connected to the first capacitor electrode CE1 of the storage capacitor Cst, the compensation source region of the compensation thin film transistor T3, and the driving gate electrode of the driving thin film transistor T1. The first initialization thin film transistor T4 may be turned on in response to the previous scan signal Sn−1 received through the previous scan line SLp to perform an initialization operation to initialize the voltage of the driving gate electrode of the driving thin film transistor T1 by transmitting the initialization voltage Vint to the driving gate electrode of the driving thin film transistor T1.

The operation control gate electrode of the operation control thin film transistor T5 may be connected to the light emitting control line EL, the operation control source region of the operation control thin film transistor T5 may be connected to the driving voltage line PL, and the operation control drain region of the operation control thin film transistor T5 may be connected to the driving source region of the driving thin film transistor T1 and the switching drain region of the switching thin film transistor T2.

The light emitting control gate electrode of the light emitting control thin film transistor T6 may be connected to the light emitting control line EL, the light emitting control source region of the light emitting control thin film transistor T6 may be connected to the driving drain region of the driving thin film transistor T1 and the compensation drain region of the compensation thin film transistor T3, and the light emitting control drain region of the light emitting control thin film transistor T6 may be electrically connected to the second initialization drain region of the second initialization thin film transistor T7 and the pixel electrode of the light emitting device LD.

The operation control thin film transistor T5 and the light emitting control thin film transistor T6 may be simultaneously turned on in response to the light emitting control signal En received through the light emitting control line EL, to transmit the driving voltage ELVDD to the light emitting device LD such that the driving current ILD flows to the light emitting device LD.

The second initialization gate electrode of the second initialization thin film transistor T7 may be connected to the next scan line SLn, the second initialization drain region of the second initialization thin film transistor T7 may be connected to the light emitting control drain region of the light emitting control thin film transistor T6 and the pixel electrode of the light emitting device LD, and the second initialization source region of the second initialization thin film transistor T7 may be connected to the second initialization voltage line VL2 to receive an anode initialization voltage Aint. The second initialization thin film transistor T7 may be turned on in response to the next scan signal Sn+1 received through the next scan line SLn to initialize the pixel electrode of the light emitting device LD.

According to another embodiment, the second initialization thin film transistor T7 may be connected to the light emitting control line EL and driven in response to the light emitting control signal En. The positions of the source regions and the drain regions may be changed according to the type (e.g., p-type or n-type) of a transistor.

The storage capacitor Cst may include the first capacitor electrode CE1 and a second capacitor electrode CE2. The first capacitor electrode CE1 of the storage capacitor Cst may be connected to the driving gate electrode of the driving thin film transistor T1, and the second capacitor electrode CE2 of the storage capacitor Cst may be connected to the driving voltage line PL. The storage capacitor Cst may store charges corresponding to a difference between the driving gate electrode voltage of the driving thin film transistor T1 and the driving voltage ELVDD.

A boosting capacitor Cbs may include a first capacitor electrode CE1' and a second capacitor electrode CE2'. The first capacitor electrode CE1' of the boosting capacitor Cbs may be connected to the first capacitor electrode CE1 of the storage capacitor Cst, and the second capacitor electrode CE2' of the boosting capacitor Cbs may receive the first scan signal Sn. The boosting capacitor Cbs may compensate for voltage drop of a gate terminal of the driving thin film transistor T1 by increasing the voltage of the gate terminal of the driving thin film transistor T1 at the time point at which the supply of the first scan signal Sn is stopped.

Hereinafter, the detailed operation of each pixel PX will be described below.

When the previous scan signal Sn−1 is supplied through the previous scan line SLp during an initialization period, the first initialization thin film transistor T4 may be turned on in response to the previous scan signal Sn−1, and the driving thin film transistor T1 may be initialized by the initialization voltage Vint supplied from the first initialization voltage line VL1.

When the first scan signal Sn and the second scan signal Sn' are supplied through the first scan line SL1 and the second scan line SL2 during a data programming period, the switching thin film transistor T2 and the compensation thin film transistor T3 may be turned on in response to the first scan signal Sn and the second scan signal Sn'. In this case, the driving thin film transistor T1 may be diode-connected by the turned-on compensation thin film transistor T3 and may be biased forward.

If then, a compensation voltage Dm+Vth (e.g., Vth is a negative (−) value), which is obtained by subtracting a threshold voltage Vth of the driving thin film transistor T1 from the data signal Dm which is supplied from the data line DL, may be applied to the driving gate electrode of the driving thin film transistor T1.

The driving voltage ELVDD and the compensation voltage Dm+Vth may be applied across opposite terminals of the storage capacitor Cst, and the storage capacitor Cst may store charges corresponding to the voltage difference between opposite terminals of the storage capacitor Cst.

The operation control thin film transistor T5 and the light emitting control thin film transistor T6 may be turned on in response to the light emitting control signal En supplied from the light emitting control line EL, during the light emitting period. The driving current ILD may be generated due to the difference between the voltage of the driving gate electrode of the driving thin film transistor T1 and the driving voltage ELVDD, and may be applied to the light emitting device LD through the light emitting control thin film transistor T6.

At least one of the plurality of thin film transistors T1 to T7 may include a semiconductor layer including an oxide, and remaining thin film transistors include a semiconductor layer including silicon.

In detail, the driving thin film transistor T1 directly exerting an influence on the brightness of the display device may be configured to include a semiconductor layer including polycrystalline silicon, thereby achieving a higher-resolution display device.

However, since the oxide semiconductor has higher carrier mobility and a lower leakage current, a significant voltage drop may not occur, even if the driving time period is long. In other words, even during low-frequency driving mode, the color of the image may not be significantly changed by the voltage drop. Accordingly, a low-frequency driving mode may be possible.

As described above, the oxide semiconductor may have a weak leakage current. Accordingly, as at least one of the compensation thin film transistor T3 connected to the driving gate electrode of the driving thin film transistor T1, the first initialization thin film transistor T4, and the second initialization thin film transistor T7 may be implemented in the oxide semiconductor, the leakage current may be reduced or prevented from flowing into the driving gate electrode while reducing power consumption.

Figure 3:
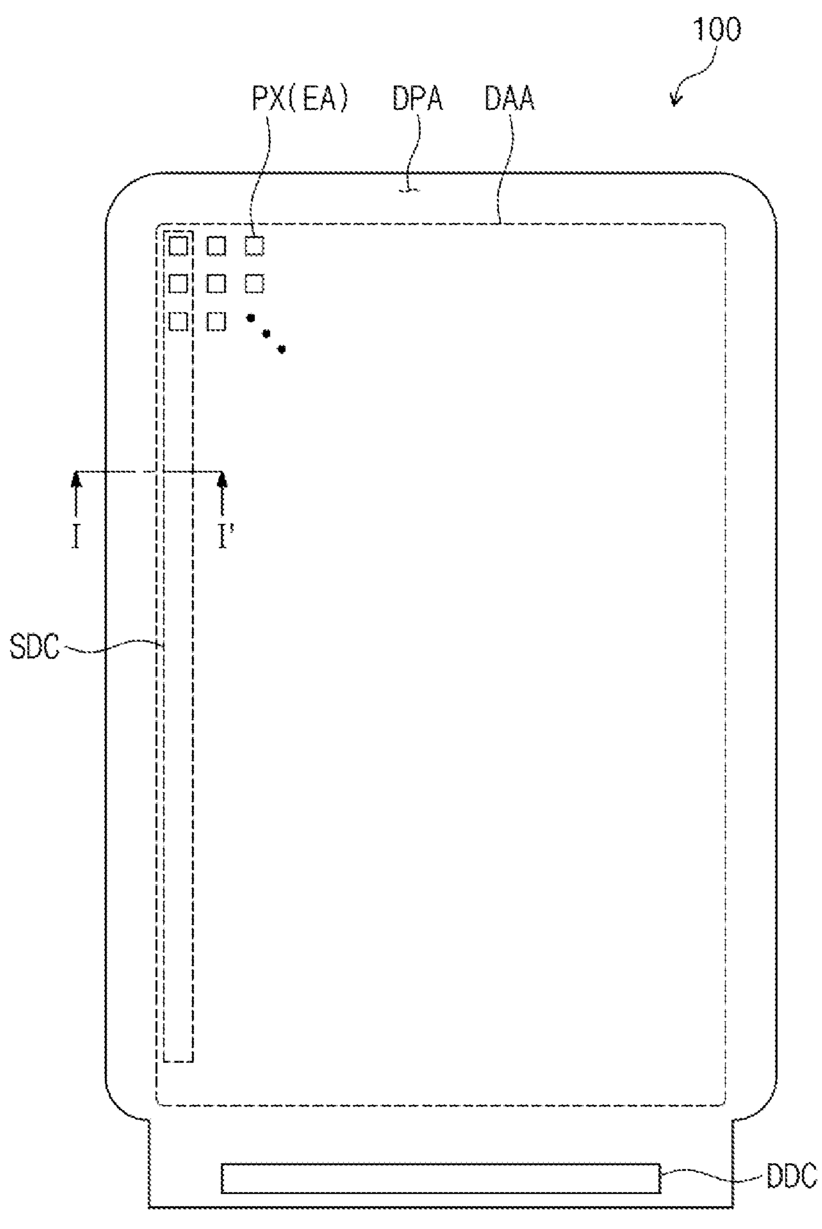
FIG. 3 is a plan view of the display panel of the electronic apparatus of FIG. 1.

FIG. 3 is plan view of the display panel of the electronic apparatus of FIG. 1. In FIG. 3, some components are omitted for illustrative convenience. Hereinafter, an embodiment will be described with reference to FIG. 3.

As illustrated in FIG. 3, a display panel 100 may be divided into a display region DAA and a peripheral region DPA. The display region DAA may include a plurality of light emitting regions EA. The light emitting regions EA may be spaced apart from each other.

The light emitting regions EA may be regions that display light. Each of the light emitting regions EA may correspond to a region in which an organic light emitting device to be described subsequently is disposed, and in particular, may correspond to a region in which a light emitting layer of the organic light emitting device is disposed. The details thereof will be described subsequently.

The peripheral region DPA may be adjacent to the display region DAA. The peripheral region DPA is illustrated in the form of surrounding the edge of the display region DAA. The scan driving circuit SDC and the data driving circuit DDC may be mounted on the display panel 100. The scan driving circuit SDC and the data driving circuit DDC may be spaced apart from each other.

The scan driving circuit SDC may be disposed in the display region DAA. The scan driving circuit SDC may overlap at least some of the light emitting regions EA when viewed in plan. Since the scan driving circuit SDC and the light emitting regions EA overlap with each other, the area of the peripheral region DPA may be reduced. Accordingly, a display device may be easily implemented to have a narrower bezel.

For example, the scan driving circuit SDC may be provided in the form of two circuits separated from each other. The two scan driving circuits SDC may be separated from each other at left and right sides of the center of the display region DAA. Alternatively, two or more scan driving circuits SDC may be provided, and embodiments are not limited thereto.

The data driving circuit DDC may be disposed in the peripheral region DPA. For example, this is provided for illustrative purposes, and the data driving circuit DDC may be disposed in the display region DAA. In this case, some of the light emitting regions EA may overlap the data driving circuit DDC when viewed in plan.

The data driving circuit DDC may be formed in the same process as that of the scan driving circuit SDC. However, this is provided for illustrative purposes. In the electronic apparatus, the data driving circuit DDC may be provided on a separate circuit board independent from the display panel 100 and connected to the display panel 100, and embodiments are not limited thereto.

Figure 4A:
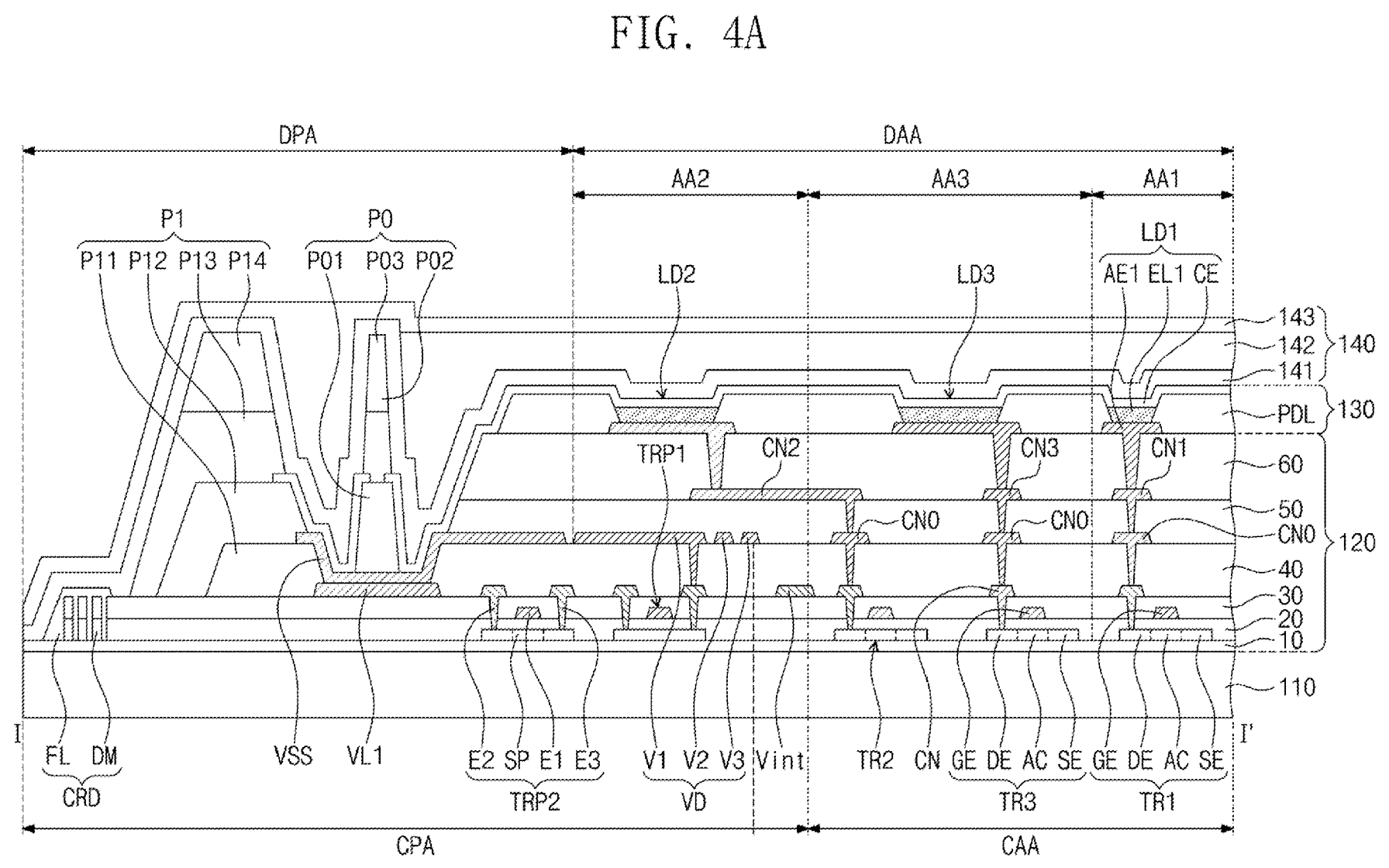
Figure 4B:
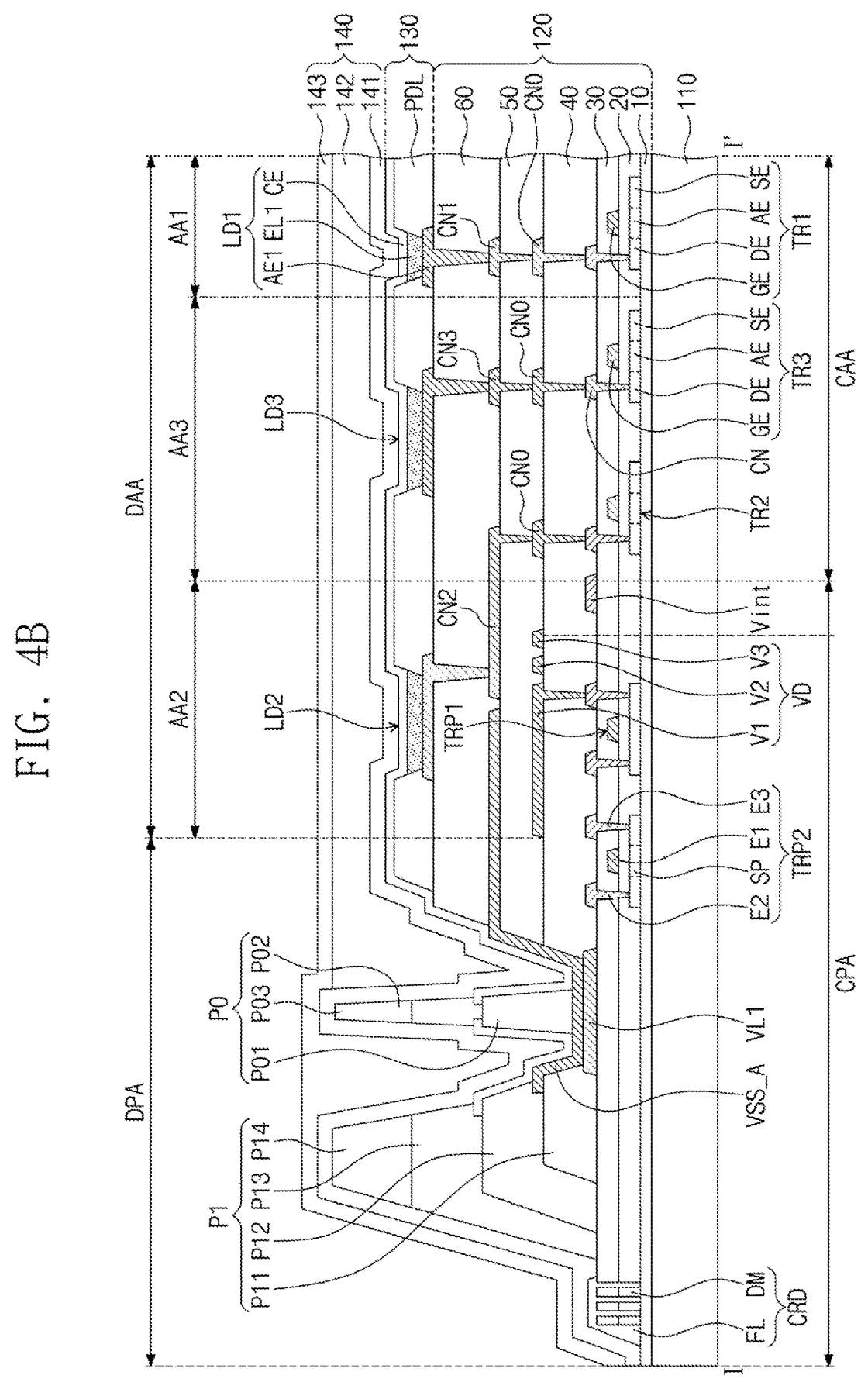

FIG. 4A is a cross-sectional view taken along line I-I' of FIG. 3. FIG. 4B is a cross-sectional view of another embodiment of the display panel taken along line I-I' of FIG. 3. Hereinafter, embodiments will be described with reference to FIGS. 4A and 4B.

As illustrated in FIG. 4A, the display panel 100 may include a base layer 110, the circuit layer 120, the light emitting device layer 130, and an encapsulation layer 140. The base layer 110 may include a base surface for disposing the circuit layer 120. The base layer 110 may be a rigid substrate, or a flexible substrate, which is capable of bending, folding, or rolling. The base layer 110 may be a glass substrate, a metal substrate, or a polymer substrate. However, embodiments are not limited thereto. For example, the base layer 110 may be an inorganic layer, an organic layer, or a composite material layer.

The base layer 110 may have a multi-layer structure. For example, the base layer 110 may include a first synthetic resin layer, an intermediate layer in a multi-layer structure or a single-layer structure, and a second synthetic resin layer disposed on the intermediate layer. The intermediate layer may be referred to as a base barrier layer. The intermediate layer may include a silicon oxide (SiOx) layer and an amorphous silicon (a-Si) layer disposed on the silicon oxide layer, but embodiments are not specifically limited thereto. For example, the intermediate layer may include at least one of a silicon oxide layer, a silicon nitride layer, a silicon oxynitride layer, or an amorphous silicon layer.

Each of the first and second synthetic resin layers may include polyimide-based resin. Also, each of the first and second synthetic resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, or perylene-based resin. The expression "~~-based resin" in the specification means that "~~-based resin" includes the functional group of "~~".

The base layer 110 may be divided into the display region DAA and the peripheral region DPA when viewed in plan. The display region DAA may include a first region AA1, a second region AA2, and a third region AA3. As described above, the display region DAA may be a region to display an image, and the peripheral region DPA may be a region adjacent to the display region DAA.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or deposition process, and then, the insulating layer, the semiconductor layer, and the conductive layer may be selectively patterned by a plurality of photolithography processes. Thereafter, the semiconductor pattern, the conductive pattern, and the signal line included in the circuit layer 120 may be formed.

The circuit layer 120 may include a plurality of insulating layers 10, 20, 30, 40, 50, 60, a pixel circuit, and a driving circuit. The base layer 110 may be divided into a pixel circuit region CAA and a driving circuit region CPA. The pixel circuit region CAA may be defined in the display region DAA, and the driving circuit region CPA may be defined to overlap a portion of the display region DAA and the peripheral region DPA. The pixel circuit region CAA and the driving circuit region CPA may be distinguished based on components disposed under light emitting devices LD1, LD2, and LD3, that is, the arrangement of the circuit layer 120.

In detail, the pixel circuit region CAA may have a pixel circuit including pixels PX (see FIG. 1). FIG. 4B illustrates three pixel transistors TR1, TR2, and TR3 of the pixel circuits. The three pixel transistors TR1, TR2, and TR3 may be connected to three light emitting devices LD1, LD2, and LD3 separated from each other.

The pixel transistors TR1, TR2, and TR3 may be disposed on the base layer 110. The first insulating layer 10 may be disposed between the base layer 110, and the pixel transistors TR1, TR2, and TR3. The first insulating layer 10 may include a barrier layer 11 and a buffer layer 12. Each of the barrier layer 11 and the buffer layer 12 may be an inorganic layer. However, this is provided for illustrative purposes. The first insulating layer 10 may have a single-layer structure, may include more many layers, and may include an organic layer, but embodiments are not limited thereto.

Each of the pixel transistors TR1, TR2, and TR3 may include a semiconductor pattern SP and a control electrode GE. The semiconductor pattern SP may include a semiconductor material such as silicon or metal oxide.

The semiconductor pattern SP may include a channel region AC, a source region SE, and a drain region DE. The channel region AC, the source region SE, and the drain region DE may be partitioned into each other when viewed in plan. The channel region AC may have conductivity lower than those of the source region SE and the drain region DE.

The source region SE and the drain region DE may include reduced metal. The source region SE and the drain region DE may function as a source electrode and a drain electrode of the first transistor TR1, respectively. However, this is provided for illustrative purposes. The first transistor TR1 may further include separate source and drain electrodes connected to the source region SE and the drain region DE, and embodiments are not limited thereto.

The control electrode GE may have conductivity. The control electrode GE may be spaced apart from the semiconductor pattern SP with the second insulating layer 20 interposed between the control electrode GE and the semiconductor pattern SP. The control electrode GE may overlap the channel region AC in the semiconductor pattern SP when viewed in plan. The second insulating layer 20 may be an inorganic layer, and may be a single layer or a multi-layer.

The third insulating layer 30, the fourth insulating layer 40, the fifth insulating layer 50, and the sixth insulating layer 60 may be sequentially stacked on the pixel transistors TR1, TR2, and TR3. Each of the third, fourth, fifth, and sixth insulating layers 30, 40, 50, and 60 may include an organic layer, or the structure in which an organic layer and an inorganic layer may be stacked on each other.

A first connection electrode CN may be interposed between the third insulating layer 30 and the fourth insulating layer 40. A plurality of first connection electrodes CN may be provided, and pass through the third insulating layer 30 and the second insulating layer 20 to be connected to the pixel transistors TR1, TR2, and TR3, respectively. Although the first connection electrode CN is connected to the drain region DE, this is provided for illustrative purposes. For example, the first connection electrode CN may be connected to the source region SE, and embodiments are not limited thereto.

A second connection electrode CN0 may be interposed between the fourth insulating layer 40 and the fifth insulating layer 50. The second connection electrode CN0 may be connected to the first connection electrode CN through the fourth insulating layer 40.

Third connection electrodes CN1, CN2, and CN3 may be interposed between the fifth insulating layer 50 and the sixth insulating layer 60. The third connection electrodes CN1, CN2, and CN3 may be connected to the second connection electrode CN0 through the fifth insulating layer 50. The third connection electrodes CN1, CN2, and CN3 may be connected to the light emitting devices LD1, LD2, and LD3.

The third connection electrodes CN1, CN2, and CN3 may include the connection electrode CN1 connected to the first light emitting device LD1, the connection electrode CN2 connected to the second light emitting device LD2, and the connection electrode CN3 connected to the third light emitting device LD3.

The connection electrode CN1 connected to the first light emitting device LD1 may be disposed in the first region AA1. The connection electrode CN3 connected to the third light emitting device LD3 may be disposed in the third region AA3. The connection electrodes CN1 connected to the first light emitting device LD1, and the connection electrodes CN3 connected to the third light emitting device LD3 may connect the first light emitting device LD1 and the third light emitting device LD3 to the pixel transistors TR1 and TR3 which are disposed in the same regions.

The connection electrode CN2 connected to the second light emitting device LD2 may be disposed in the second region AA2. The connection electrode CN2 connected to the second light emitting device LD2 may overlap the second region AA2 and the third region AA3. The connection electrode CN2 connected to the second light emitting device LD2 may connect the second light emitting device LD2 and the second pixel transistor TR2, which are disposed in mutually different regions, to each other. The connection electrode CN2 connected to the second light emitting device LD2 may have a larger size (e.g., a larger planar area) than that of the connection electrode CN1 connected to the first light emitting device LD1 or the connection electrode CN3 connected to the third light emitting device LD3.

The light emitting device layer 130 may be disposed on the circuit layer 120. The light emitting device layer 130 may include the light emitting devices LD1, LD2, and LD3, and a pixel defining layer PDL. For example, each of the light emitting devices LD1, LD2, and LD3 may include an organic light emitting material, an inorganic light emitting material, an organic-inorganic light emitting material, a quantum dot, a quantum rod, a micro-LED, or a nano-LED.

The light emitting devices LD1, LD2, and LD3 may be disposed on the sixth insulating layer 60, and each of the light emitting devices LD1, LD2, and LD3 may be electrically connected to a relevant one of the pixel transistors TR1, TR2, and TR3 through a relevant one of the third connection electrodes CN1, CN2, and CN3. The encapsulation layer 140 may be disposed on the light emitting device layer 130. The encapsulation layer 140 may protect the light emitting device layer 130 from foreign substances such as moisture, oxygen, and dust particles.

The encapsulation layer 140 may be disposed on the light emitting device layer 130. The encapsulation layer 140 may include an inorganic layer 141, an organic layer 142, and an inorganic layer 143 sequentially stacked on each other, but embodiments are not limited thereto.

The inorganic layer 141 and the inorganic layer 143 may protect the light emitting device layer 130 from moisture and oxygen, and the organic layer 142 may protect the light emitting device layer 130 from foreign substances such as dust particles. The inorganic layer 141 and the inorganic layer 143 may include a silicon nitride layer, a silicon oxynitride layer, a silicon oxide layer, a titanium oxide layer, or an aluminum oxide layer. The organic layer 142 may include an acryl-based organic layer, and embodiments are not limited thereto.

The light emitting devices LD1, LD2, and LD3 include the first light emitting device LD1 disposed in the first region AA1, the second light emitting device LD2 disposed in the second region AA2, and the third light emitting device LD3 disposed in the third region AA3. The first light emitting device LD1, the second light emitting device LD2, and the third light emitting device LD3 may be provided in a plural form, but is provided in a singular form for the convenience of explanation in the illustrated embodiment.

The first light emitting device LD1 may be disposed in the first region AA1 that is the same region as a region for the first pixel transistor connected to the first light emitting device LD1. The first light emitting device LD1 may overlap the first pixel transistor connected to the first light emitting device LD1 when viewed in plan. The first region AA1 may be defined in the pixel circuit region CAA.

The first light emitting device LD1 may include a first electrode AE1, a second electrode CE, and a light emitting layer EL1. The first electrode AE1 may be disposed on the sixth insulating layer 60 and may be connected to the connection electrode CN1 through the sixth insulating layer 60

The first electrode AE1 may include a reflective layer formed of Ag, Mg, Al, Pt, Pd, Au, Ni, Nd, Ir, Cr, or a compound thereof, and a transparent electrode layer or a semi-transparent electrode layer formed on the reflective layer. The transparent electrode layer or a semi-transparent electrode layer may include at least one selected from the group consisting of indium tin oxide (ITO), indium zinc oxide (IZO), indium gallium zinc oxide (IGZO), zinc oxide (ZnO) or indium oxide ($In_2O_3$), or aluminum doped zinc oxide (AZO). For example, the first electrode AE1 may be formed in a multi-layer structure of ITO/Ag/ITO.

The pixel defining layer PDL may include an organic material and/or an inorganic material. The pixel defining layer PDL may include an opening exposing at least a portion of the first electrode AE1. The light emitting devices LD1, LD2, and LD3 may be respectively disposed in the openings to define a light emitting region (e.g., a light emitting part).

The light emitting layer EL1 may be disposed in an opening defined in the pixel defining layer PDL. The light emitting layer EL1 may include an organic light emitting material and/or an inorganic light emitting material. The first light emitting device LD1 may generate light by exciting or activating the light emitting layer EL1 by the potential difference between the first electrode AE1 and the second electrode CE.

The second electrode CE may be disposed on the pixel defining layer PDL. The second electrode CE may be provided in an integral form to cover a plurality of light emitting layers. The second electrode CE may be formed on the entire surface of the display region DAA.

A hole control layer may be interposed between the first electrode AE1 and the light emitting layer EL. The hole control layer may include a hole transport layer and may further include a hole injection layer. An electron control layer may be interposed between the light emitting layer EL and the second electrode CE. The electron control layer may include an electron transport layer, and may further include an electron injection layer. The hole control layer and the electron control layer may be formed, in common, in a plurality of pixels PX (see FIG. 1) by using an open mask.

The second light emitting device LD2 may be disposed in the second region AA2 of the display region DAA. The second region AA2 may be a region in which light emitting devices, which do not overlap the pixel transistors connected thereto, may be disposed. In addition, the second region AA2 may be a region overlapping the driving circuit region CPA and, particularly a region overlapping the scan driving circuit SDC (see FIG. 3).

The driving circuit region CPA may include circuit components, such as the scan driving circuit SDC (refer to FIG. 1), the initialization voltage line Vint, the first power supply voltage line VL1, and the second power supply voltage line VL2, other than the pixel circuit unit.

The initialization voltage line Vint may be disposed on the display region DAA and may overlap the second region AA2. A conductive line disposed on the fourth insulating layer 40 may be connected to the initialization voltage line Vint through the fourth insulating layer 40, and may extend toward the pixel circuit region CAA to provide an initialization voltage to the pixel driving circuit.

The scan driving circuit SDC and the initialization voltage line Vint may be disposed in a region overlapping the display region DAA of the driving circuit region CPA. FIGS. 4A and 4B illustrate first and second driving transistors TRP1 and TRP2 of the scan driving circuit SDC.

The first driving transistor TRP1 may include a semiconductor pattern SP, a control electrode E1, an input electrode E2, and an output electrode E3. The first and second driving transistors TRP1 and TRP2 may be formed by the same process as those of the pixel transistors TR1, TR2, and TR3. The first and second driving transistors TRP1 and TRP2 may not overlap the pixel transistors TR1, TR2, and TR3 when viewed in plan.

The second light emitting device LD2 may be disposed in a region different from that of the second pixel transistor TR2. The second light emitting device LD2 does not overlap the second pixel transistor TR2 when viewed in plan and overlaps the first and second driving transistors TRP1 and TRP2 constituting the scan driving circuit SDC when viewed in plan. Accordingly, the second connection electrode CN2 may extend from the third region AA3 to the second region AA2 to connect the second light emitting device LD2 to the second pixel transistor TR2.

The third light emitting device LD3 may be disposed in the third region AA3. The third region AA3 may be a region defined between the first region AA1 and the second region AA2, and may overlap a portion of the pixel circuit region CAA. The third region AA3 may be omitted.

Each of the second and third light emitting devices LD2 and LD3 may have substantially the same structure as that of the first light emitting device LD1. In other words, each of the second light emitting device LD2 and the third light emitting device LD3 may include a first electrode and a light emitting layer respectively disposed in an opening defined in the pixel defining layer PDL, and may have a second electrode CE, which is provided in common with the first light emitting device LD1. However, this is provided for illustrative purposes. For example, the first, second, and third light emitting devices LD1, LD2, and LD3 may have different structures, and embodiments are not limited thereto.

According to the principles and illustrative embodiments of the invention, the scan driving circuit SDC may include a driving signal lines VD. For example, three driving signal lines, i.e., the first, second, and third lines V1, V2, and V3 of the driving signal lines VD are illustrated.

The first line V1 may be provided to have a size (e.g., a planar area) larger than that of the second line V2 or the third line V3. The first line V1 is illustrated as being connected to the first driving transistor TRP1.

The first line V1 may transmit or apply a substantially constant voltage to the first driving transistor TRP1. The substantially constant voltage may include a gate turn-off voltage VGL or a gate turn-on voltage VGH. However, this is provided for illustrative purposes, For example, the first line V1 may be any one of various lines to apply the substantially constant voltage to the scan driving circuit SDC, and embodiments are not limited thereto.

The first line V1 may overlap the second light emitting device LD2 when viewed in plan. The first line V1 may electrically shield the second light emitting device LD2 and the scan driving line. The first line V1 may protect the second light emitting device LD2 from noise caused by the first and second driving transistors TRP1 and TRP2. Thus, the operation of the second light emitting device LD2 may not be influenced or affected by noise caused by the first and second driving transistors TRP1 and TRP2. For example, the first line V1 of the driving signal lines VD may function as a shielding component, such as a shielding electrode. Accordingly, it is not necessary to add a separate electrode for electrically shielding the second light emitting device LD2 and the scan driving line, and the cost and the time for manufacturing the display device may be reduced and minimized.

For example, in the display panel, the power supply voltage pattern VSS shown in FIG. 4A may be disposed on the same layer as the first line V1. The power supply voltage pattern VSS may be connected to the first line VL1 to receive the first power supply voltage.

The display panel 100 may include a conductive pattern CDP. The conductive pattern CDP may overlap the display region DAA when viewed in plan. The conductive pattern CDP may overlap the second region AA2 of the display region DAA, and the peripheral region DPA.

The display panel 100 may include a plurality of dams P0 and P1 and a crack dam CRD. The dams P0 and P1 may be disposed along the edge of the display region DDA when viewed in plan. The dams P0 and P1 prevent overflow of the organic layer 72. The dams P0 and P1 may include the first dam P0 and the second dam P1.

The first dam P0 may be closer to the display region DAA than the second dam P1. The first dam P0 may overlap the first line VL1. The first dam P0 may include a first layer P01, a second layer P02, and a third layer P03. Each of the first layer P01, the second layer P02, and the third layer P03 may be formed of an insulating material. The first layer P01 may be formed of the same material as that of the fifth insulating layer 50, and the second layer P02 and the third layer P03 may be formed of the same material as that of the sixth insulating layer 60 and/or the pixel defining layer PDL.

The second dam P1 of the dams P0 and P1 may be further away from the display region DAA. The second dam P1 may include a first layer P11, a second layer P12, a third layer P13, and a fourth layer P14. For example, the first layer P11 may be formed of the same material as that of the fourth insulating layer 40. The second layer P12 may be formed of the same material as that of the fifth insulating layer 50. The third layer P13 and the fourth layer P14 may be formed of the same material as that of the sixth insulating layer 60 and/or the pixel defining layer PDL. The first dam P0 and the second dam P1 may have the substantially same layer structure. For example, an additional dam in addition to the first dam P0 and the second dam P1 may be further disposed in the peripheral region DPA. However, embodiments are not limited thereto.

A crack dam CRD may be disposed in the peripheral region DPA and disposed at ends of the second insulating layer 20 and the third insulating layer 30. The crack dam CRD may include a dam part DM and a filling part FL. The dam part DM may include a plurality of insulating patterns spaced apart from the display region DAA in a direction toward the edge of the display panel 100. The insulating patterns may be formed of the same material as those of the second insulating layer 20 and the third insulating layer 30 and formed simultaneously with the second insulating layer 20 and the third insulating layer 30.

The filling part FL may include an organic material. The filling part FL may be formed of a material having softness higher (e.g., hardness lower) than that of the dam part DM. The filling part FL may cover the dam part DM and may be filled between the insulating patterns.

Referring to the embodiment shown in FIG. 4B, a power supply voltage pattern VSS_A may be disposed in a layer different from that of the first line V1 when viewed in plan. The power supply voltage pattern VSS_A may be disposed on the same layer (e.g., the fifth insulating layer 50), on which the third connection electrodes CN1, CN2, and CN3 are disposed. Thus, the embodiment shown in FIG. 4B is different from the embodiment shown in FIG. 4A in the structures of the power supply voltage patterns VSS and VSS_A thereof. For example, the power supply voltage pattern VSS in FIG. 4A may not overlap the first line V1 and the second light emitting device LD2 when viewed in plan, but the power supply voltage pattern VSS_A in FIG. 4B may overlap the first line V1 and the second light emitting device LD2 when viewed in plan.

The first line V1 may be formed to overlap the power supply voltage pattern VSS_A and the second light emitting device LD2 when viewed in plan. The first line V1 may be disposed in a different layer than that of the power supply voltage pattern VSS_A when viewed in plan, thereby reducing or preventing a problem caused by interference with the power supply voltage pattern VSS_A. Accordingly, the first line V1 may be formed to have a larger area, thereby stably forming electrical shielding between the power supply voltage pattern VSS_A and the second light emitting device LD2 and the scan driving circuit.

At least a portion of the driving signal line VD may function as a shielding electrode. Accordingly, even if the light emitting device LD2 overlaps the scan driving circuit SDC, electrical influence (e.g., noise interference) may be reduced or prevented, thereby preventing a defect caused by such noise. Accordingly, a display panel may have an improved display quality and improved electrical reliability.

Figure 5:
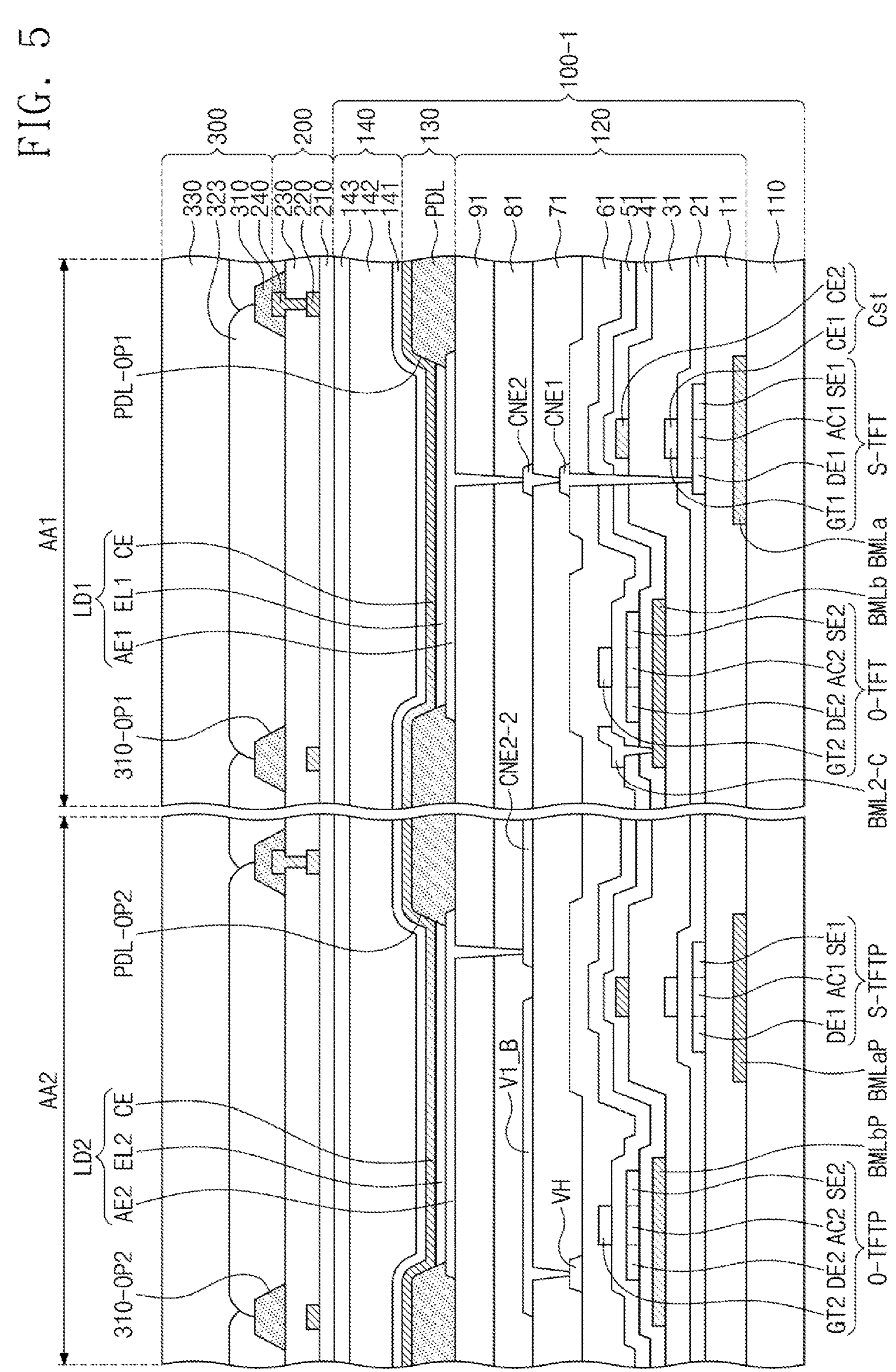
FIG. 5 is an enlarged cross-sectional view illustrating another embodiment of regions AA1 and AA2.

FIG. 5 is a cross-sectional view illustrating another embodiment of regions AA1 and AA2.

As illustrated in FIG. 5, an electronic apparatus may include a transistor (hereinafter referred to as an oxide thin film transistor O-TFT) including an oxide semiconductor and a transistor (hereinafter referred to as a silicon thin film transistor P-TFT) including a polysilicon semiconductor. In addition, the electronic apparatus may further include a sensor layer 200. Hereinafter, the electronic apparatus will be described with reference to FIG. 5. Hereinafter, the same or similar components as the components described with reference to FIGS. 1 to 4B will be assigned to the same reference numerals as those of the components described with reference to FIG. 5, and repetitive descriptions will be omitted to avoid redundancy.

Referring to FIG. 5, the display panel 100 may include a plurality of insulating layers, a semiconductor pattern, a conductive pattern, and a signal line. The insulating layer, the semiconductor layer, and the conductive layer may be formed in various manners, such as a coating manner, or a deposition manner. Thereafter, the insulating layer, the semiconductor layer, and the conductive layer may be selectively patterned by a photolithography manner. In such a manner, the semiconductor pattern, the conductive pattern, and the signal line included in the circuit layer 120 and the light emitting device layer 130 may be formed. Thereafter, the encapsulation layer 140 may be formed to cover the light emitting device layer 130. Hereinafter, the details of components, which correspond to the above-described components, of components of the display panel 100 will be omitted to avoid redundancy.

The circuit layer 120 of FIG. 5 may include more many insulating layers 11 to 91, when compared to the circuit layer 120 illustrated in FIG. 4A, and may differ from the circuit layer 120 illustrated in FIG. 4A in positions of a semiconductor layer or metal layers. Hereinafter, the details thereof will be described with reference to FIG. 5.

The buffer layer 11 may be disposed on the base layer 110. The buffer layer 11 may prevent metal atoms or impurities from being spread or permeated into a first semiconductor pattern. In addition, the buffer layer 11 may adjust the heat transfer rate during a crystallization process for forming the first semiconductor pattern, such that the first semiconductor pattern may be uniformly formed. The buffer layer 11 may correspond to the first insulating layer 10 (see FIG. 4A).

A first back metal layer BMLa may be disposed under a silicon thin film transistor S-TFT, and a second back metal layer BMLb may be disposed under an oxide thin film transistor O-TFT. The first back metal layer BMLa and the second back metal layer BMLb may overlap the silicon thin film transistor S-TFT and the oxide thin film transistor O-TFT, respectively, under the silicon thin film transistor S-TFT and the oxide thin film transistor O-TFT, thereby protecting the silicon thin film transistor S-TFT and the oxide thin film transistor O-TFT. The first back metal layer BMLa and the second back metal layer BMLb may block external light from reaching the silicon thin film transistor S-TFT and the oxide thin film transistor O-TFT.

The first back metal layer BMLa may correspond to at least a portion of the pixel circuit PC (see FIG. 2B). The first back metal layer BMLa may overlap the driving thin film transistor T1 (see FIG. 2B) including the silicon thin film transistor S-TFT.

The first back metal layer BMLa may be interposed between the base layer 110 and the buffer layer 11. The first back metal layer BMLa may be disposed on the base layer 110 having an organic layer and an inorganic layer alternately stacked on each other. An inorganic barrier layer may be further interposed between the first back metal layer BMLa and the buffer layer 11. The first back metal layer BMLa may be connected to an electrode or an electric line to receive a substantially constant voltage or a signal from the electrode or the electric line. The first back metal layer BMLa may be isolated or insulated from another electrode or another electric line.

The second back metal layer BMLb may correspond to at a lower portion of the oxide thin film transistor O-TFT. The second back metal layer BMLb may be interposed between a first interlayer insulating layer 31 and a second interlayer insulating layer 41. The second back metal layer BMLb and the second capacitor electrode CE2 of the storage capacitor Cst may be disposed on the same layer (e.g., the first interlayer insulating layer 31). The second back metal layer BMLb may be connected to a contact electrode BML2-C to receive a substantially constant voltage or a signal from the contact electrode BML2-C. The contact electrode BML2-C and a second gate electrode GT2 of the oxide thin film transistor O-TFT may be disposed on the same layer (e.g., the second gate insulating layer 51).

Each of the first back metal layer BMLa and the second back metal layer BMLb may include a reflective metal. The first back metal layer BMLa and the second back metal layer BMLb may include silver (Ag), an alloy containing silver (Ag), molybdenum (Mo), an alloy containing molybdenum (Mo), aluminum (Al), an alloy containing aluminum (Al), an aluminum nitride (AlN), tungsten (W), a tungsten nitride (WN), copper (Cu), and p+ doped amorphous silicon. The first back metal layer BMLa and the second back metal layer BMLb may include the same material or different materials.

The first semiconductor pattern may be disposed on the buffer layer 11. The first semiconductor pattern may include a silicon semiconductor. For example, the silicon semiconductor may include amorphous silicon, or polycrystalline silicon. For example, the first semiconductor pattern may include low-temperature polysilicon.

FIG. 5 illustrates only a portion of the first semiconductor pattern disposed on the buffer layer 11, and another portion of the first semiconductor pattern may be additionally disposed in another region. The first semiconductor pattern may be arranged in a specific rule or manner, across the pixels. The first semiconductor pattern may have different electrical properties according to whether it is doped or undoped. The first semiconductor pattern may include a first region having higher conductivity and a second region having lower conductivity. The first region may be doped with an N-type dopant or a P-type dopant. A P-type transistor may include a doping region doped with the P-type dopant, and an N-type transistor may include a doping region doped with the N-type dopant. The second region may be a non-doping region or may be a region doped at a concentration lower than the concentration of the first region.

The conductivity of the first region may be higher than the conductivity of the second region. The first region may substantially function as an electrode or a signal line. The second region may substantially correspond to an active region (e.g., channel region) of a transistor. In other words, a portion of the first semiconductor pattern may be an active region of a transistor, another portion of the first semiconductor pattern may be a source region or a drain region of the transistor, and still another portion of the first semiconductor pattern may be a connection electrode or a connection signal line.

A source region SE1, an active region AC1, and a drain region DE1 of the silicon thin film transistor S-TFT may be formed from the first semiconductor pattern. The source region SE1 and the drain region DE1 may extend in directions opposite to each other from the active region AC1 when viewed in a cross-sectional view.

The first gate insulating layer 21 may be disposed on the buffer layer 11. The first gate insulating layer 21 may overlap a plurality of pixels in common and may cover the first semiconductor pattern. The first gate insulating layer 21 may be an inorganic layer and/or an organic layer, and may have a single-layer structure or a multi-layer structure. The first gate insulating layer 21 may include at least one of an aluminum oxide, a titanium oxide, a silicon oxide, a silicon nitride, a silicon oxynitride, a zirconium oxide, or a hafnium oxide. The first gate insulating layer 21 may be a single-layer silicon oxide layer. The first gate insulating layer 21 and an insulating layer of the circuit layer 120, which is to be described subsequently, may be an inorganic layer and/or an organic layer, and may have a single-layer structure or a multi-layer structure. The inorganic layer may include at least one of the above-described materials, but embodiments are not limited thereto.

A gate electrode GT1 of the silicon thin film transistor S-TFT may be disposed on the second insulating layer 21. The gate electrode GT1 may be a portion of a metal pattern. The gate electrode GT1 may overlap the active region AC1. The gate electrode GT1 may function as a mask in a process of doping the first semiconductor pattern. The gate electrode GT1 may include titanium (Ti), silver (Ag), an alloy containing silver (Ag), molybdenum (Mo), an alloy containing molybdenum (Mo), aluminum (Al), an alloy containing aluminum (Al), an aluminum nitride (AlN), tungsten (W), a tungsten nitride (WN), copper (Cu), indium tin oxide (ITO), and indium zinc oxide (IZO), but embodiments are not limited thereto.

A first interlayer insulating layer 31 may be disposed on the first gate insulating layer 21 and may cover the gate electrode GT1. The first interlayer insulating layer 31 may be an inorganic layer and/or an organic layer, and may have a single-layer structure or a multi-layer structure. The first interlayer insulating layer 31 may include at least one of a silicon oxide, a silicon nitride, or silicon oxynitride. The first interlayer insulating layer 31 may have a multi-layer structure including a silicon oxide layer and a silicon nitride layer.

The second interlayer insulating layer 41 may be disposed on the first interlayer insulating layer 31. The second interlayer insulating layer 41 may have a single-layer structure or a multi-layer structure. For example, the second interlayer insulating layer 41 may have a multi-layer structure including a silicon oxide layer and a silicon nitride layer. The second capacitor electrode CE2 of the storage capacitor Cst may be interposed between the first interlayer insulating layer 31 and the second interlayer insulating layer 41. In addition, the first capacitor electrode CE1 of the storage capacitor Cst may be interposed between the first gate insulating layer 21 and the first interlayer insulating layer 31.

A second semiconductor pattern may be disposed on the second interlayer insulating layer 41. The second semiconductor pattern may include an oxide semiconductor. A source region SE2, an active region AC2, and a drain region DE2 of the oxide thin film transistor O-TFT may be formed from the second semiconductor pattern. The source region SE2 and the drain region DE2 may extend in directions opposite to each other from the active region AC2 when viewed in a cross-sectional view.

The second gate insulating layer 51 may be disposed on the second interlayer insulating layer 41. The second gate insulating layer 51 may overlap a plurality of pixels in common and may cover the second semiconductor pattern. The second gate insulating layer 51 may include at least one of an aluminum oxide, a titanium oxide, a silicon oxide, a silicon nitride, a silicon oxynitride, a zirconium oxide, or a hafnium oxide.

The gate electrode GT2 of the oxide thin film transistor O-TFT may be disposed on the second gate insulating layer 51. The gate electrode GT2 may be a portion of a metal pattern. The gate electrode GT2 may overlap the active region AC2. The gate electrode GT2 may function as a mask in a process of doping the second semiconductor pattern.

The third interlayer insulating layer 61 may be disposed on the second gate insulating layer 51 and may cover the gate electrode GT2. The third interlayer insulating layer 61 may be an inorganic layer and/or an organic layer, and may have a single-layer structure or a multi-layer structure.

A first connection electrode CNE1 may be disposed on the third interlayer insulating layer 61. The first connection electrode CNE1 may be connected to the drain region DE1 of the silicon thin film transistor S-TFT through a contact hole formed through the insulating layers 21, 31, 41, 51, and 61 disposed under the first connection electrode CNE1.

The fourth interlayer insulating layer 71 may be disposed on the third interlayer insulating layer 61. A second connection electrode CNE2 may be disposed on the fourth interlayer insulating layer 71. The second connection electrode CNE2 may be connected to the first connection electrode CNE1 through the fourth interlayer insulating layer 71. The fifth interlayer insulating layer 81 may be disposed on the fourth interlayer insulating layer 71 and may cover the second connection electrode CNE2. The sixth interlayer insulating layer 91 may be disposed on the fifth interlayer insulating layer 81.

The fourth interlayer insulating layer 71, the fifth interlayer insulating layer 81, and the sixth interlayer insulating layer 91 may be organic layers. For example, the fourth interlayer insulating layer 71, the fifth interlayer insulating layer 81, and the sixth interlayer insulating layer 91 may include general purpose polymers such as benzocyclobutene (BCB), polyimide, hexamethyldisiloxane (HMDSO), polymethylmethacrylate (PMMA) or polystyrene (PS), a polymer derivative having a phenolic group, an acrylic polymer, an imide-based polymer, an acryl ether polymer, an amide-based polymer, a fluorine-based polymer, a p-xylene-based polymer, a vinyl alcohol-based polymer, and the blend thereof.

The scan driving circuit disposed in the second region AA2 may be formed to be substantially identical to the pixel driving circuit provided in the first region AA1. In detail, the scan driving circuit may include a driving transistor (hereinafter, a silicon driving transistor S-TFTP) including a polysilicon semiconductor and a driving transistor (herein, an oxide driving transistor O-TFTP) including an oxide semiconductor. The silicon driving transistor S-TFTP and the oxide driving transistor O-TFTP may have the same structures as those of the silicon thin film transistor S-TFT and the oxide thin film transistor O-TFTP.

A first line V1_B disposed in the second region AA2 may be interposed between the fourth interlayer insulating layer 71 and the fifth interlayer insulating layer 810. In this case, the first line V1_B may be connected to a driving line VH disposed on the third interlayer insulating layer 61. The driving line VH may include lines constituting the scan driving circuit, and may be connected to any one of the driving thin film transistors S-TFTP and O-TFTP. The first line V1_B may be disposed in a layer different from that of the driving line VH to electrically shield the second light emitting device LD2 from the scan driving circuit.

The first line V1_B may include a material different from that of the driving line VH. For example, the driving line VH may include an opaque conductive material, the first line V1_B may include a transparent conductive material. However, this is provided for illustrative purposes. For example, the first line V1_B may include the same material as that of the driving line VH, and embodiments are not limited thereto.

A connection electrode CNE2-2 and the first line V1_B may be disposed on the same layer (e.g., the fourth interlayer insulating layer 71). In this case, the first line V1_B may be spaced from the connection electrode CNE2-2 to be electrically insulated from the connection electrode CNE2-2 when viewed in plan. According to the illustrated embodiment, although the first line V1_B and the connection electrode CNE2-2 are disposed on the same layer, the overlap area with the second light emitting device LD2 may be as enlarge as much as possible, thereby electrically shielding the second light emitting device LD2 from the scan driving circuit. This specific structure is provided only for illustrative purposes. Electronic apparatuses constructed according to the principles of the invention may have various layer structures as long as the electronic apparatus uses the first line V1_B connected to the scan driving line as a shielding electrode.

As described above, the light emitting device layer 130 including the first, second, and third light emitting devices LD1, LD2, and LD3 may be disposed on the circuit layer 120. The first light emitting device LD1 may include a first pixel electrode AE1, a first light emitting layer EL1, and the common electrode CE. The second light emitting device LD2 may include a second pixel electrode AE2, a second light emitting device AE2, and the common electrode CE. The third light emitting device LD3 may include a third pixel electrode AE3, a third light emitting layer EL3, and the common electrode CE. The details thereof will be described subsequently.

The pixel defining layer PDL may be disposed on the sixth interlayer insulating layer 91. A plurality of openings may be defined in the pixel defining layer PDL. According to an embodiment, a first opening PDL-OP1 defined in the first region AA1 and a second opening PDL-OP2 defined in the second region AA2 are illustrated. The first opening PDL-OP1 may overlap the first electrode AE1 of the first light emitting device LD1, and the second opening PDL-OP2 may overlap the first electrode AE2 of the second light emitting device LD2.

The first opening PDL-OP1 and the second opening PDL-OP2 may have different sizes (e.g., different planar areas). For example, the second opening PDL-OP2 may have an area larger than the first opening PDL-OP1. Accordingly, even if the second region AA2 has light emitting devices distributed at a density lower than a density of light emitting devices in the first region AA1, a larger light emitting area may be ensured to reduce the difference in brightness between the first region AA1 and the second region AA2. Accordingly, substantially uniform brightness may be achieved in the display region DAA.

However, this feature is provided for illustrative purposes. For example, when the brightness characteristic is not reduced, the first opening PDL-OP1 and the second opening PDL-OP2 may have substantially the same size (e.g., same planar area). Alternatively, the first opening PDL-OP1 may have a size (e.g., a planar area) smaller than that of the second opening PDL-OP2, but embodiments are not limited thereto.

The pixel defining layer PDL may have a absorbing light property. For example, the pixel defining layer PDL may have a black color. The pixel defining layer PDL may include a black coloring agent. For example, the black coloring agent may include a black dye, a black pigment, or may include a metal, such as carbon black or chromium, or an oxide thereof.

The encapsulation layer 140 may be disposed on the light emitting device layer 130. The sensor layer 200 may be disposed on the display panel 100. The sensor layer 200 may be referred to as a sensor, an input sensing layer, or an input sensing panel. The sensor layer 200 may include a base layer 210, a first conductive layer 220, a sensing insulating layer 230, and a second conductive layer 240.

The base layer 210 may be disposed on the display panel 100. The base layer 210 may be an inorganic layer including at least one of silicon nitride, silicon oxynitride, and silicon oxide. Alternatively, the base layer 210 may be an organic layer including an epoxy resin, an acrylate resin, or an imide-based resin. The base layer 210 may have a single-layer structure or may have a multi-layer structure stacked in the third direction DR3.

Each of the first conductive layer 220 and the second conductive layer 240 may have a single-layer structure or a multi-layer structure stacked in the third direction DR3.

A conductive layer of the single-layer structure may include a metal layer or a transparent conductive layer. The metal layer may include molybdenum, silver, titanium, copper, aluminum, or the alloy thereof. The transparent conductive layer may include transparent conductive oxide, such as indium tin oxide (ITO), indium zinc oxide (IZO), zinc oxide (ZnO), or indium zinc tin oxide (IZTO). In addition, the conductive layer may include a conductive polymer, such as PEDOT, a metal nano-wire, or graphene. The conductive layer may be formed of various materials as long as the conductive layer may have conductivity, and embodiments are not limited thereto.

A conductive layer in the multi-layer structure may include metal layers. The metal layers may, for example, have a three-layer structure of titanium/aluminum/titanium. The conductive layer of the multi-layer structure may include at least one metal layer and at least one transparent conductive layer.

The sensing insulating layer 230 may be interposed between the first conductive layer 220 and the second conductive layer 240. The sensing insulating layer 230 may include an inorganic layer. The inorganic layer may include at least one of an aluminum oxide, a titanium oxide, a silicon oxide, a silicon nitride, a silicon oxynitride, a zirconium oxide, or a hafnium oxide.

The sensing insulating layer 230 may include an inorganic layer. The organic layer may include at least one of acrylate-based resin, methacrylate-based resin, polyisoprene-based resin, vinyl-based resin, epoxy-based resin, urethane-based resin, cellulose-based resin, siloxane-based resin, polyimide-based resin, polyamide-based resin, and perylene-based resin.

The anti-reflective layer 300 may be disposed on the sensor layer 200. The anti-reflective layer 300 may include a partition layer 310, a color filter 323, and a planarization layer 330.

A material constituting the partition layer 310 may be not specifically limited thereto, as long as the material absorbs light. The partition layer 310 may have a layer having a black color. The partition layer 310 may include a black coloring agent. The black coloring agent may include a black dye, and a black pigment. The black coloring agent may include a metal, such as carbon black or chromium, or an oxide thereof.

The partition layer 310 may cover the second conductive layer 240 of the sensor layer 200. The partition layer 310 may prevent the reflection of external light from the second conductive layer 240. A plurality of openings 310-OP1 and 310-OP2 may be defined in the partition layer 310. The first opening 310-OP1 may overlap the first electrode AE1 of the first light emitting device LD1, and the second opening 310-OP2 may overlap the first electrode AE2 of the second light emitting device LD2.

The color filter 323 may overlap the light emitting devices LD1 and LD2, in detail, the first electrodes AE1 and AE2. The planarization layer 330 may cover the partition layer 310 and the color filter 323. The planarization layer 330 may include an organic material, and may provide a flat surface on a top surface of the planarization layer 330. Alternatively, the planarization layer 330 may be omitted.

The sensor layer 200 and the anti-reflective layer 300 are illustrated as being disposed in both the first region AA1 and the second region AA2. However, this structure is provided for illustrative purposes. For example, in other embodiments, the sensor layer 200 or the anti-reflective layer 300 may be omitted from the second region AA2.

Figure 6A:
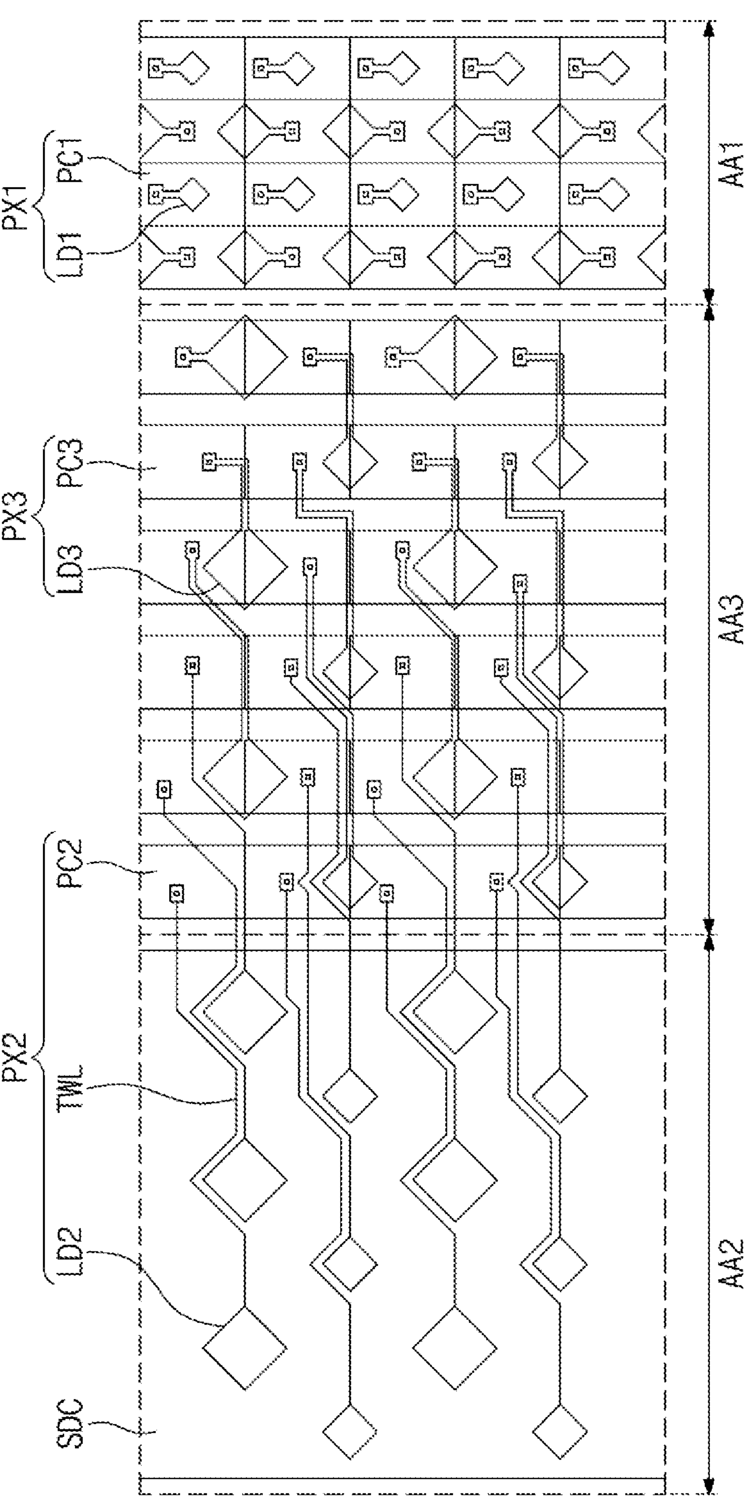
FIG. 6A is a plan view of another embodiment of regions AA1, AA2, and AA3.
Figure 6B:
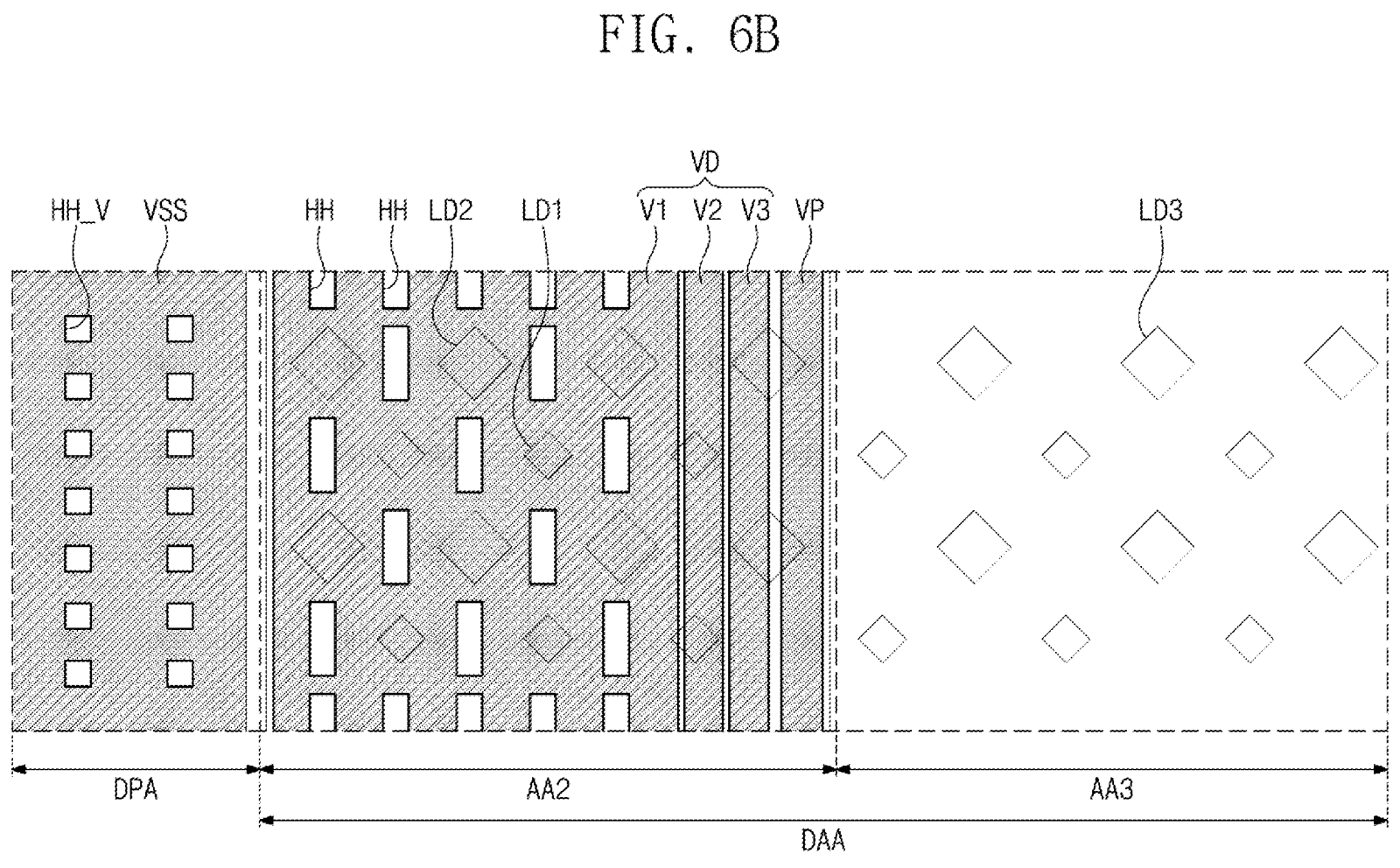
Figure 6C:
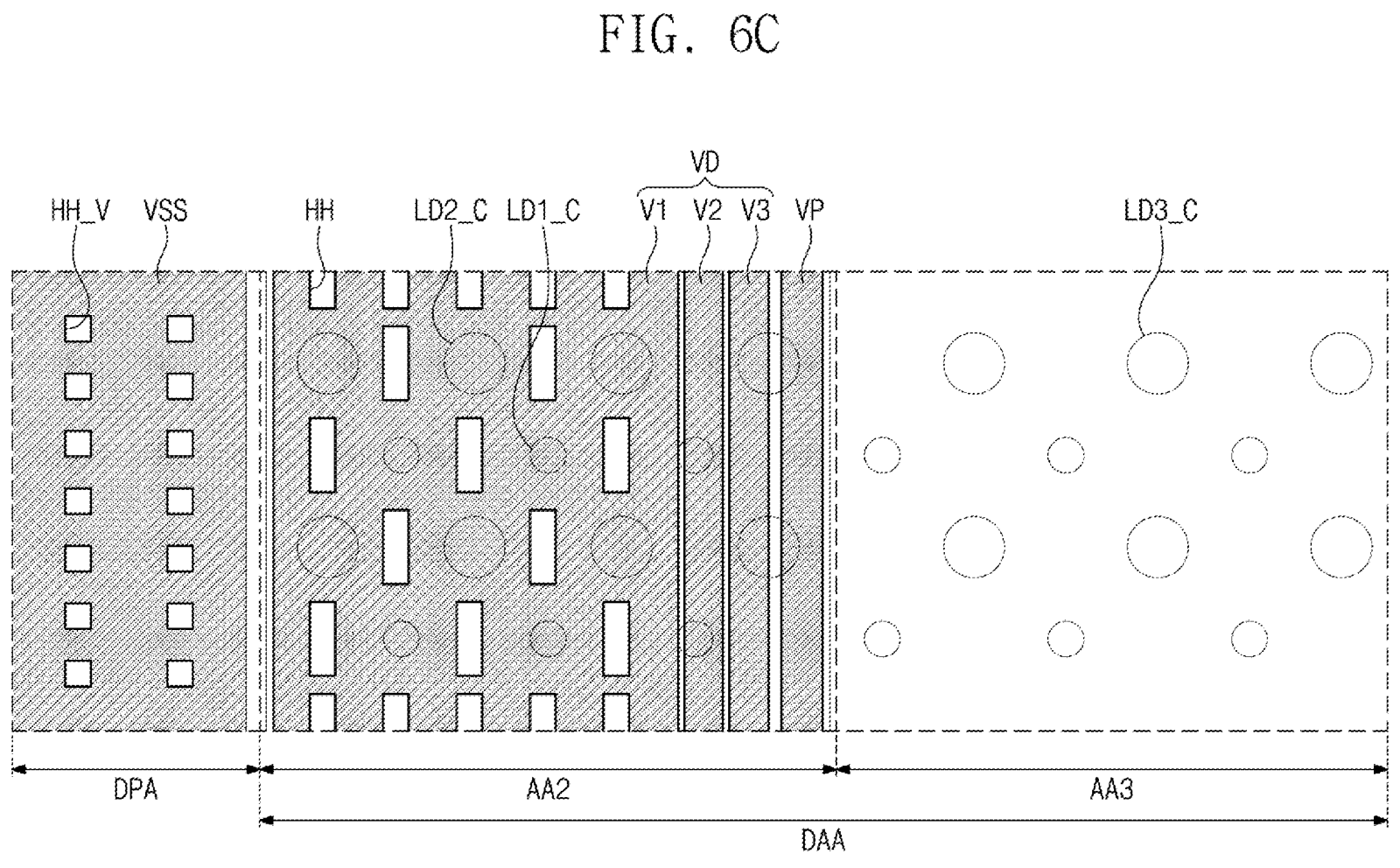

FIG. 6A is a plan view illustrating a portion of a display panel. FIG. 6B is a plan view illustrating a part of a display panel. FIG. 6C is a plan view illustrating a portion of a display panel. FIG. 6A illustrates a portion of the first, second, and third regions AA1, AA2, and AA3 of regions illustrated in FIG. 4A, and FIGS. 6B and 6C illustrate portions of the second and third regions AA2 and AA3 and a peripheral region DPA. Hereinafter, an embodiment will be described with reference to FIGS. 6A, 6B, and 6C. Hereinafter, the same or similar components as components described with reference to FIGS. 1 to 5 will be assigned to the same reference numerals as those of the components described with reference to FIGS. 6A-6C, and repetitive descriptions will be omitted to avoid redundancy.

Referring to FIG. 6A, the display panel 100 may include a plurality of pixels PX. The pixels PX may include a first pixel PX1, a second pixel PX2, and a third pixel PX3 that are divided based on the light emitting regions. The first pixel PX1 may emit light in the first region AA1, the second pixel PX2 may emit light in the second region AA2, and the third pixel PX3 may emit light in the third region AA3.

Each of the first pixel PX1, the second pixel PX2, and the third pixel PX3 may be provided in plural. In this case, each of the first, second, and third pixels PX1, PX2, and PX3 may include a red pixel, a green pixel, and a blue pixel, and may further include a white pixel.

The first pixel PX1 may include the first light emitting device LD1 and a first pixel circuit PC1 to drive the first light emitting device LD1, the second pixel PX2 may include the second light emitting device LD2 and a second pixel circuit PC2 to drive the second light emitting device LD2, and the third pixel PX3 may include the third light emitting device LD3 and a third pixel circuit PC3 to drive the third light emitting device LD3.

The shapes of the first, second, and third light emitting devices LD1, LD2, and LD3 may correspond to the shapes of light emitting patterns, substantially, the shapes of the openings defined in the pixel defining layer PDL (see FIG. 5). For example, each of the shapes of the first, second, and third light emitting devices LD1, LD2, and LD3 though illustrated in a diamond shape, may have various other shapes, such as a polygonal shape, a circular shape, an oval shape, a figure having at least one curved side, or an atypical shape. However, embodiments are not limited thereto.

A plurality of first light emitting devices LD1, a plurality of second light emitting devices LD2, and a plurality of third light emitting devices LD3 may be provided. The distance between two first light emitting devices, which is closest to each other, of the second light emitting devices LD2 may be greater than the distance between two first light emitting devices, which are closest to each other, of the first light emitting devices LD1. The distance between two third light emitting devices, which is closest to each other, of the third light emitting devices LD3 may be greater than a distance between two first light emitting devices, which are closest to each other, of the first light emitting devices LD1.

The number of the second pixels PX2 disposed in the second region AA2 may be less than the number of the first pixels PX1 disposed in the first region AA1, within a unit area or the same area. For example, the resolution of the second region AA2 may be about ½, ⅜, ⅓, ¼, 2/9, ⅛, 1/9 or 1/16 of the resolution of the first region AA1.

The first pixel PX1 may include the first light emitting device LD1 and the first pixel circuit PC1 disposed in the first region AA1. The first light emitting device LD1 may be disposed at a position overlapping the first pixel circuit PC1 when viewed in plan. In detail, the anode electrode or the light emitting pattern of the first light emitting device LD1 may be disposed at a position overlapping the first pixel circuit PC1 when viewed in plan.

The second pixel PX2 may include the second light emitting device LD2 disposed in the second region AA2 and the second pixel circuit PC2 disposed in the third region AA3. The second light emitting device LD2 may be disposed at a position overlapping the scan driving circuit SDC when viewed in plan. Accordingly, the second light emitting device LD2 may be disposed at a position not overlapping the second pixel circuit PC2 when viewed in plan.

In detail, the anode electrode or the light emitting pattern of the second light emitting device LD2 may be disposed at a position spaced apart from the second pixel circuit PC2 when viewed in plan. Accordingly, the second pixel PX2 may further include a connection line TWL. The connection line TWL may electrically connect the second light emitting device LD2 disposed in the second region AA2 and the second pixel circuit PC2 disposed in the third region AA3. The connection line TWL may correspond to the connection electrode CNE2, which is connected to the second light emitting device LD2, of the above-described third connection electrode. The connection line TWL may include various materials, such as metal, a transparent conductive oxide (TCO), or a conductive polymer such as a poly(3,4-ethylenedioxythiophene) (PEDOT), or graphene, but embodiments are not limited thereto.

The third pixel PX3 may include the third light emitting device LD3 disposed in the third region AA3 and the third pixel circuit PC3 disposed in the third region AA3. The third light emitting device LD3 disposed in the third region AA3 may be disposed at a position that overlaps or does not overlap the third pixel circuit PC3 when viewed in plan.

Referring to FIGS. 6B and 6C, the driving signal lines VD may be disposed in the second region AA2. The first line V1, the second line V2, and the third line V3 of the driving signal lines VD may be arranged in one direction. The first, second, and third lines V1, V2, and V3 may transmit signals independent from each other.

The first line V1 may have an area larger than that of the second line V2 or the third line V3. The first line V1 may overlap a first group of second light emitting devices LD2 when viewed in plan. The second line V2 and the third line V3 may overlap a second group of second light emitting devices LD2 when viewed in plan. The number of the first group of second light emitting devices LD2 may be greater than the number of the second group of second light emitting devices LD2. As described above, the first line V1 may shield an electrical influence between the driving circuit and the second light emitting devices LD2.

Some of pixel signal lines may be disposed in the second region AA2. FIG. 6B illustrates that one pixel signal line VD of the pixel signal lines. The pixel signal line VD may transmit an electrical signal to the pixel circuits PC1, PC2, and PC3. For example, the pixel signal line VD may transmit an initialization signal. However, this is provided for illustrative purposes. For example, the pixel signal line VD may be a line for providing various electrical signals transmitted to the pixel circuits PC1, PC2, and PC3, but embodiments are not limited thereto. For example, the pixel signal line VD may be disposed in the third region AA3 or the first region AA1, but embodiments are not limited thereto.

The power supply voltage pattern VSS may overlap the peripheral region DPA. The power supply voltage pattern VSS may connect a power line that is spaced apart from the driving circuit and the light emitting devices LD1, LD2, and LD3. The power supply voltage pattern VSS may transmit the above-described second power supply voltage ELVSS.

A plurality of through holes HH_V may be defined in the power supply voltage pattern VSS. The power supply voltage pattern VSS may be disposed on the organic layer. The through holes HH_V may expose the organic layer. Accordingly, gas, which is generated from the organic layer, may be stably discharged in the process of forming the power supply voltage pattern VSS, thereby improving process reliability.

A plurality of through-holes HH may be defined in the first line V1. The first line V1 may be disposed on the organic layer. The organic layer may be exposed through the through holes HH. Accordingly, gas, which is generated from the organic layer, may be stably discharged in the process of forming the first line V1, thereby improving process reliability. For example, the organic layer exposed through the through holes HH of the first line V1 may be identical to or different form the organic layer exposed through the through holes HH of the power supply voltage pattern VSS.

The through holes HH may be defined in regions spaced apart from the second light emitting devices LD2. Accordingly, even if the through-holes HH are formed, the influence of the through-holes HH on the role of the shielding electrode of the first line V1 may be reduced.

As illustrated in FIG. 6C, light emitting devices LD1_C, LD2_C, and LD3_C may have a circular shape when viewed in plan. As the through holes HH are formed to not overlap the light emitting devices LD1_C, LD2_C, and LD3_C when viewed in plan, the first line V1 may stably perform a function of shielding the light emitting devices LD1_C, LD2_C, and LD3_C having various shapes.

Figure 7A:
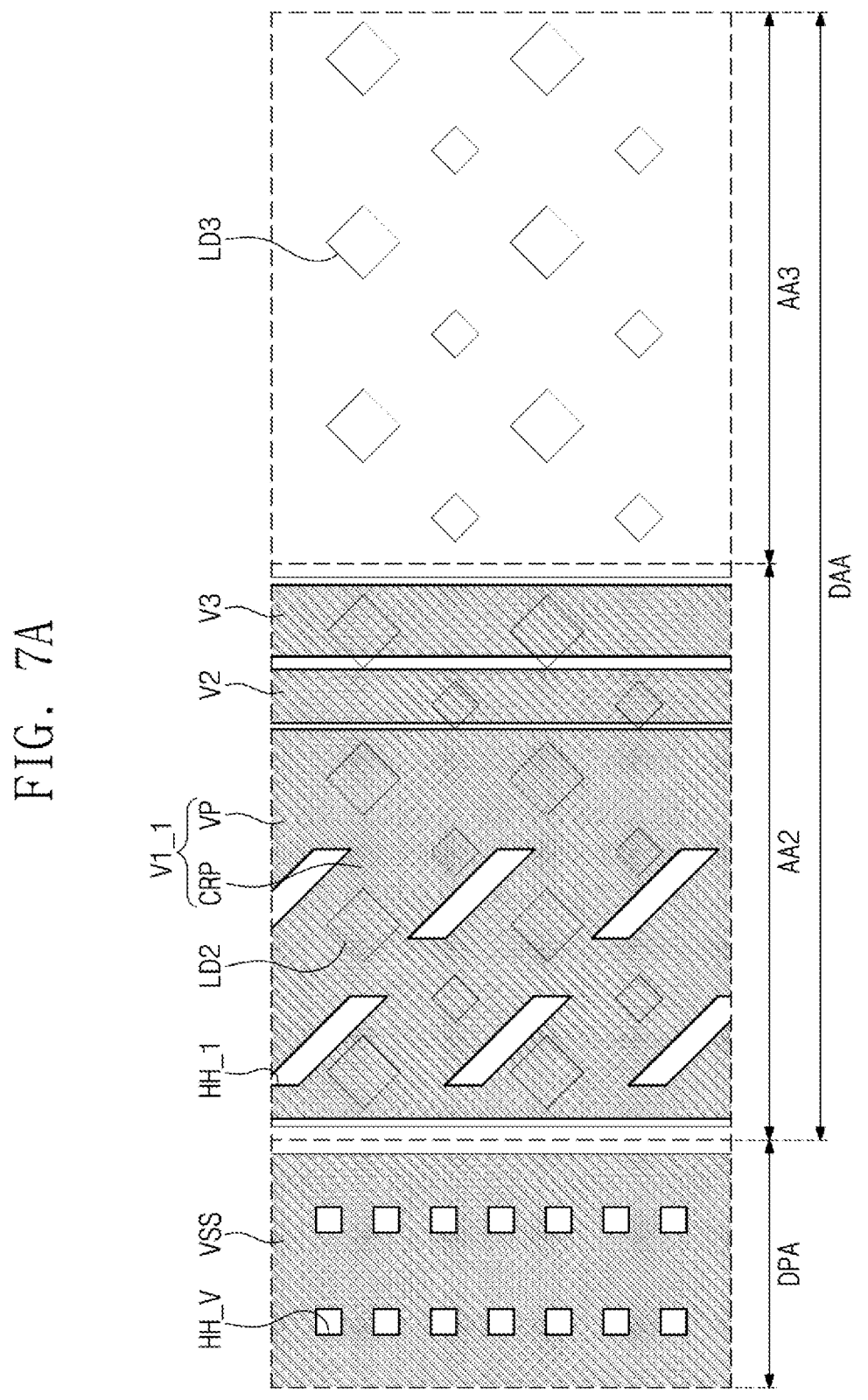
Figure 7B:
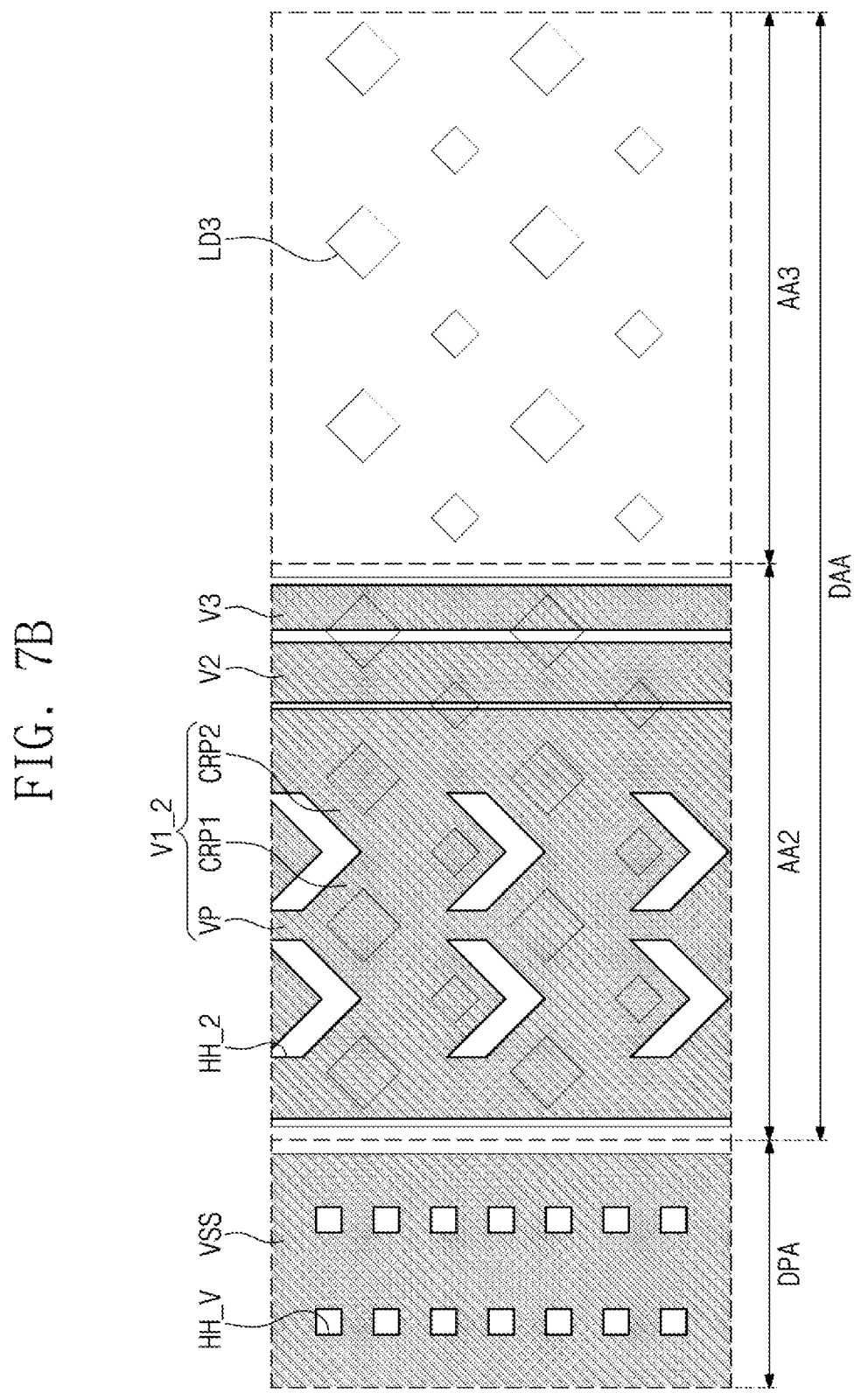

FIGS. 7A and 7B are plan views of yet other embodiments of the regions shown in FIG. 6B.

As illustrated in FIG. 7A, through holes HH_1 defined in a first line V1_1 may have a shape extending in a generally diagonal direction. Each of the through holes HH_1 may have inclined side surfaces. The illustrated through holes HH_1 may have a parallelogram shape.

The first line V1_1 may include a plurality of vertical parts VP and a plurality of intersecting parts CRP to surround the through holes HH_1. The vertical parts VP may extend in a vertical direction to be spaced apart from each other in a horizontal direction. The intersecting parts CRP may be parts disposed between the vertical parts VP to connect the vertical parts VP to each other. The intersecting parts CRP may extend in a direction inclined with respect to the vertical parts VP. In other words, the intersecting parts CRP may have an acute angle or an obtuse angle with respect to the vertical parts VP.

Alternatively, as illustrated in FIG. 7B, through holes HH_2 defined in a first line V1_2 may have a shape generally corresponding to the alphabet letter "V". Since the through holes HH_2 have a bent shape, the through holes HH_2 may be easily formed at positions that do not overlap with the light emitting devices LD2 having various arrangements. The through holes HH_2 may have various shapes, such as a regular shape or an irregular shape, and embodiments are not limited thereto.

The first line V1_2 may include a plurality of vertical parts VP, first intersecting parts CRP1, and second intersecting parts CRP2 to surround the through holes HH_2. The first intersecting parts CRP1 and the second intersecting parts CRP2 may be disposed between the vertical parts VP to connect the vertical parts VP to each other. The first intersecting parts CRP1 and the second intersecting parts CRP2 may extend in an inclined direction of intersecting each other.

Display panel panels constructed according to the principles of the invention may have through holes defined in various shapes and may not overlap the light emitting devices LD2. Accordingly, the display panel may include various shapes of first power lines V1_1 and V1_2, but embodiments are not limited thereto.

Display panels and electronic apparatus including the same constructed according to the principles and illustrative embodiments of the invention may have a large display region that has been expanded to a peripheral area such as the bevel, as the driving circuit can be moved to the display area.

In addition, display panels and electronic apparatus including the same constructed according to the principles and illustrative embodiments of the invention have improved process reliability, electrical reliability, and visibility compared to conventional devices.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:

a base layer having a first region, a second region, and a third region defined between the first region and the second region;

a driving circuit spaced apart from the first region and the third region, and disposed in the second region;

a first pixel comprising a first pixel transistor disposed in the first region and a first light emitting device disposed in the first region and connected to the first pixel transistor, and the first pixel transistor and the first light emitting device apart from the driving circuit, the second region, and the third region in plan view;

a second pixel comprising a second pixel transistor disposed in the third region and a second light emitting device disposed in the second region to overlap the driving circuit when viewed in a-plan view, the second light emitting device connected to the second pixel transistor, and the second pixel transistor apart from the driving circuit, the first region, and the third region in plan view, and the second light emitting device apart from the first region and the third region in plan view; and a shielding component disposed in the second region, interposed between the driving circuit and the second light emitting device, and configured to receive a constant voltage.

2. The display panel of claim 1, wherein the shielding component is configured to provide the constant voltage to the driving circuit.

3. The display panel of claim 2, wherein the constant voltage is a gate turn-off voltage or a gate turn-on voltage.

4. The display panel of claim 1, wherein the shielding component comprises a shielding electrode including:

a plurality of openings exposing an organic layer.

5. The display panel of claim 4, wherein the plurality of openings comprise a plurality of through holes spaced apart from the first light emitting device and the second light emitting device when viewed in a plan view.

6. The display panel of claim 4, wherein the second pixel further comprises:

a connection line connecting the second light emitting device to the second pixel transistor, and wherein the connection line is disposed in a first layer different from a second layer of the second light emitting device.

7. The display panel of claim 6, wherein the shielding electrode overlaps the connection line when viewed in plan view.

8. The display panel of claim 6, wherein the shielding electrode is spaced apart from the connection line when viewed in plan view.

9. The display panel of claim 1, further comprising:

an initialization voltage line connected to the first pixel and the second pixel; and a power supply voltage line connected to the first pixel and the second pixel, wherein the shielding component is spaced apart from the initialization voltage line and the power supply voltage line when viewed in plan view.

10. An electronic apparatus comprising:

a base layer having a first region and a second region;

a driving circuit comprising a plurality of stage circuits spaced apart from the first region and disposed in the second region and a conductive pattern to provide a constant voltage to each of the plurality of stage circuits;

a first pixel comprising a first light emitting device disposed in the first region; and a second pixel comprising a second light emitting device disposed in the second region, wherein each of the first pixel and the second pixel receives a gate signal from the driving circuit, and wherein the conductive pattern overlaps an entirety of the second light emitting device when viewed in a-plan view.

11. The electronic apparatus of claim 10, further comprising:

a conductive line to supply the constant voltage to the first pixel and the second pixel, wherein the conductive pattern is spaced apart from the conductive line, when viewed in plan view.

12. The electronic apparatus of claim 11, wherein the constant voltage is a gate turn-off voltage or a gate turn-on voltage.

13. The electronic apparatus of claim 11, further comprising:

a power supply line configured to provide a power supply voltage to the first pixel and the second pixel, wherein the conductive pattern is spaced apart from the power supply line when viewed in plan view.

14. The electronic apparatus of claim 11, wherein the first pixel comprises:

a first thin film transistor comprising an oxide semiconductor; and a second thin film transistor comprising silicon.

15. The electronic apparatus of claim 11, further comprising:

a color filter disposed on the first pixel; and a sensing layer interposed between the first pixel and the color filter to sense an external input.

16. The electronic apparatus of claim 10, wherein the conductive pattern comprises a plurality of vertical parts and a plurality of intersecting parts connected to the plurality of vertical parts, and wherein the conductive pattern has a plurality of openings defined at least in part by the plurality of vertical parts and the plurality of intersecting parts.

17. The electronic apparatus of claim 16, wherein the plurality of openings comprise a plurality of through holes exposing an organic layer.

18. The electronic apparatus of claim 17, wherein the plurality of through holes are defined by the first light emitting device and the second light emitting device.

19. The electronic apparatus of claim 18, wherein at least some of the plurality of intersecting parts comprise:

a first part interposed between the plurality of vertical parts and inclined in one direction; and a second part interposed between the plurality of vertical parts, connected to the first part, and inclined in a direction different than the one direction.

20. The electronic apparatus of claim 16, wherein at least some of the plurality of intersecting parts are inclined with an acute angle with respect to each of the plurality of vertical parts.

* * * * *